(12) United States Patent
Osato et al.

(10) Patent No.: US 11,391,876 B2
(45) Date of Patent: Jul. 19, 2022

(54) OPTICALLY ANISOTROPIC LAMINATE, CIRCULARLY POLARIZING PLATE AND IMAGE DISPLAY DEVICE

(71) Applicant: ZEON CORPORATION, Tokyo (JP)

(72) Inventors: Kazuhiro Osato, Tokyo (JP); Masashi Aimatsu, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 197 days.

(21) Appl. No.: 16/482,787

(22) PCT Filed: Feb. 14, 2018

(86) PCT No.: PCT/JP2018/005121
§ 371 (c)(1),
(2) Date: Aug. 1, 2019

(87) PCT Pub. No.: WO2018/159297
PCT Pub. Date: Sep. 7, 2018

(65) Prior Publication Data
US 2020/0233133 A1    Jul. 23, 2020

(30) Foreign Application Priority Data

Feb. 28, 2017 (JP) .............................. JP2017-037591

(51) Int. Cl.
*G02B 5/30* (2006.01)
*B32B 7/12* (2006.01)
(Continued)

(52) U.S. Cl.
CPC .............. *G02B 5/3083* (2013.01); *B32B 7/12* (2013.01); *B32B 27/08* (2013.01); *B32B 27/302* (2013.01);
(Continued)

(58) Field of Classification Search
CPC ... G02B 5/3083; G02B 1/04; G02F 1/133631; G02F 2413/06; G02F 1/133541;
(Continued)

(56) References Cited

U.S. PATENT DOCUMENTS

| 6,565,974 B1 | 5/2003 | Uchiyama et al. |
| 2005/0231660 A1 | 10/2005 | Fujita et al. |

(Continued)

FOREIGN PATENT DOCUMENTS

| EP | 1045261 A1 | 10/2000 |
| JP | 2004184575 A | 7/2004 |

(Continued)

OTHER PUBLICATIONS

Sep. 3, 2019, International Preliminary Report on Patentability issued in the International Patent Application No. PCT/JP2018/005121.

(Continued)

*Primary Examiner* — Anthony J Frost
(74) *Attorney, Agent, or Firm* — Kenja IP Law PC

(57) ABSTRACT

An optically anisotropic layered body including a first optically anisotropic layer and a second optically anisotropic layer, wherein the first optically anisotropic layer satisfies 220 nm<Re1(590)<330 nm, Re1(450)/Re1(550)≤1.0, Re1(650)/Re1(550)≥1.0, and 0.95<NZ1<2.00, and the second optically anisotropic layer satisfies 110 nm<Re2(590)<165 nm, Re2(450)/Re2(550)≤1.0, Re2(650)/Re2(550)≥1.0, and −1.5≤NZ2≤0.00.

6 Claims, 4 Drawing Sheets

(51) Int. Cl.
  *B32B 27/08* (2006.01)
  *B32B 27/30* (2006.01)
  *G02F 1/13363* (2006.01)
  *G02B 1/04* (2006.01)
  *G02F 1/1335* (2006.01)
  *H01L 51/52* (2006.01)

(52) U.S. Cl.
  CPC ......... *G02B 1/04* (2013.01); *G02F 1/133631* (2021.01); *B32B 2457/20* (2013.01); *C09K 2323/00* (2020.08); *C09K 2323/03* (2020.08); *C09K 2323/05* (2020.08); *G02F 1/13363* (2013.01); *G02F 1/133528* (2013.01); *G02F 1/133541* (2021.01); *G02F 1/133638* (2021.01); *G02F 2413/06* (2013.01); *H01L 51/5281* (2013.01)

(58) Field of Classification Search
  CPC ......... G02F 1/133638; G02F 1/133528; G02F 1/13363; G02F 2413/07; G02F 2413/02; G02F 1/133635; B32B 7/12; B32B 27/08; B32B 27/302; B32B 2457/20; H01L 51/5281; B29D 11/00644; B29D 11/0073; H05B 33/02; G09F 9/30
  See application file for complete search history.

(56) References Cited

U.S. PATENT DOCUMENTS

| | | |
|---|---|---|
| 2009/0296027 A1 | 12/2009 | Kawamoto et al. |
| 2013/0244041 A1* | 9/2013 | Cho .................. C08L 33/04 428/412 |
| 2014/0168768 A1* | 6/2014 | Seo ....................... G02B 5/3083 359/489.07 |
| 2014/0268333 A1* | 9/2014 | Tanaka ..................... G02B 1/04 359/489.07 |
| 2015/0048339 A1* | 2/2015 | Kinohira .............. H01L 51/5281 257/40 |
| 2015/0062505 A1 | 3/2015 | Hatanaka et al. |
| 2015/0070764 A1 | 3/2015 | Hatanaka et al. |
| 2015/0219814 A1* | 8/2015 | Qin ..................... G02B 5/3083 359/489.02 |
| 2015/0316696 A1* | 11/2015 | Kamijo ................... G02B 1/14 359/487.02 |
| 2016/0216408 A1 | 7/2016 | Tanaka et al. |
| 2017/0261668 A1 | 9/2017 | Hatano et al. |
| 2017/0299880 A1 | 10/2017 | Osato |

FOREIGN PATENT DOCUMENTS

| | | |
|---|---|---|
| JP | 2005326818 A | 11/2005 |
| JP | 2007328310 A | 12/2007 |
| JP | 2011138144 A | 7/2011 |
| JP | 2013076982 A | 4/2013 |
| JP | 2014071209 A | 4/2014 |
| JP | 2014123099 A | 7/2014 |
| JP | 2015040904 A | 3/2015 |
| JP | 2015079230 A | 4/2015 |
| KR | 100602815 B1 | 7/2006 |
| WO | 0026705 A1 | 5/2000 |
| WO | 2016043124 A1 | 3/2016 |
| WO | 2016047517 A1 | 3/2016 |

OTHER PUBLICATIONS

May 15, 2018, International Search Report issued in the International Patent Application No. PCT/JP2018/005121.

* cited by examiner

OPTICALLY ANISOTROPIC LAMINATE, CIRCULARLY POLARIZING PLATE AND IMAGE DISPLAY DEVICE

FIELD

The present invention relates to an optically anisotropic layered body, and a circular polarizing plate and an image display device that include the optically anisotropic layered body.

BACKGROUND

An image display device such as a liquid crystal display device and an organic electroluminescent display device (hereinafter also appropriately referred to as "organic EL display device") is usually provided with an optically anisotropic film as an optical film. Various studies have been made on such an optical film to date (see Patent Literatures 1 to 7).

CITATION LIST

Patent Literature

Patent Literature 1: Japanese Patent Application Laid-Open No. 2014-071209 A
Patent Literature 2: Japanese Patent Application Laid-Open No. 2014-123099 A
Patent Literature 3: Japanese Patent Application Laid-Open No. 2011-138144 A
Patent Literature 4: Japanese Patent Application Laid-Open No. 2015-040904 A
Patent Literature 5: Japanese Patent Application Laid-Open No. 2015-079230 A (corresponding publication: U.S. Patent Application Publication No. 2015/062505)
Patent Literature 6: Japanese Patent Application Laid-Open No. 2007-328310 A (corresponding publication: U.S. Patent Application Publication No. 2009/296027)
Patent Literature 7: Japanese Patent Application Laid-Open No. 2005-326818 A (corresponding publication: U.S. Patent Application Publication No. 2005/231660)

SUMMARY

Technical Problem

In an image display device, a circular polarizing plate is sometimes used for improving visibility of an image viewed through polarized sunglasses. The circular polarizing plate may be constituted by a linear polarizer and a ¼ wave plate. As the ¼ wave plate, for example, a stretched polymer compound film obtained by stretching a polymer compound film may be used.

An ideal ¼ wave plate functions as the ¼ wave plate for all wavelengths. However, a prior-art stretched polymer compound film actually exhibits a forward wavelength distribution property in which an in-plane retardation generally becomes small as a wavelength becomes longer, and thus it may not function as the ¼ wave plate depending on the wavelength. Thus, when a film which exhibits the forward wavelength distribution property is used as the ¼ wave plate, linearly polarized light having passed through the circular polarizing plate is not converted to ideal circularly polarized light but converted to elliptically polarized light depending on the wavelength of the linearly polarized light. As a result, when a display surface of an image display device including the circular polarizing plate is rotated within the same plane as that of the display surface while being viewed through the polarized sunglasses from a front direction of the display surface, a color tone of the image sometimes undesirably changes.

The present inventor has found that a wide-band ¼ wave plate capable of functioning as the ¼ wave plate in a wide wavelength range can be obtained by laminating a ½ wave plate exhibiting a reverse wavelength distribution property in which an in-plane retardation becomes larger as a wavelength becomes longer and a ¼ wave plate exhibiting the reverse wavelength distribution property and has further found that a circular polarizing plate including this wide-band ¼ wave plate can significantly reduce a change in a color tone of the image.

However, even if such a circular polarizing plate including the wide-band ¼ wave plate is used, when the display surface of the image display device is rotated within the same plane as that of the display surface while being viewed from a tilt direction of the display surface, the color tone of the image still sometimes changes.

The present invention has been made in view of the aforementioned problems, and an object of the present invention is to provide: an optically anisotropic layered body capable of reducing a change in a color tone which occurs when a display surface of an image display device is rotated while the image display device is viewed through polarized sunglasses from a front direction or a tilt direction of the display surface; and a circular polarizing plate and an image display device that include the aforementioned optically anisotropic layered body.

Solution to Problem

The present inventor has conducted intensive studies to solve the aforementioned problems. As a result, the inventor has found that the aforementioned problems can be solved by: an optically anisotropic layered body which includes a first optically anisotropic layer exhibiting a reverse wavelength distribution property and having a specific NZ factor and a second optically anisotropic layer exhibiting a reverse wavelength distribution property and having a specific NZ factor; and a circular polarizing plate and an image display device that include the aforementioned optically anisotropic layered body.

That is, the present invention is as follows.

<1> An optically anisotropic layered body comprising a first optically anisotropic layer and a second optically anisotropic layer,
the first optically anisotropic layer satisfying the following formula (1), formula (2), formula (3), and formula (4), and
the second optically anisotropic layer satisfying the following formula (5), formula (6), formula (7), and formula (8):

$$220 \text{ nm} < Re1(590) < 330 \text{ nm} \tag{1}$$

$$Re1(450)/Re1(550) \le 1.0 \tag{2}$$

$$Re1(650)/Re1(550) \ge 1.0 \tag{3}$$

$$0.95 < NZ1 < 2.00 \tag{4}$$

$$110 \text{ nm} < Re2(590) < 165 \text{ nm} \tag{5}$$

$$Re2(450)/Re2(550) \le 1.0 \tag{6}$$

$$Re2(650)/Re2(550) \geq 1.0 \quad (7)$$

$$-1.5 \leq NZ2 \leq 0.00 \quad (8)$$

wherein

Re1(450), Re1(550), Re1(590), and Re1(650) represent in-plane retardations Re of the first optically anisotropic layer at wavelengths of 450 nm, 550 nm, 590 nm, and 650 nm, respectively, NZ1 represents an NZ factor of the first optically anisotropic layer at a wavelength of 590 nm, Re2(450), Re2(550), Re2(590), and Re2(650) represent in-plane retardations Re of the second optically anisotropic layer at wavelengths of 450 nm, 550 nm, 590 nm, and 650 nm, respectively, and NZ2 represents an NZ factor of the second optically anisotropic layer at a wavelength of 590 nm.

<2> The optically anisotropic layered body according to <1>, wherein an angle formed by a direction that gives a maximum refractive index nx1 in a plane of the first optically anisotropic layer and a direction that gives a maximum refractive index nx2 in a plane of the second optically anisotropic layer is 60°±10°.

<3> The optically anisotropic layered body according to <1> or <2>, wherein the second optically anisotropic layer includes a layer formed of a resin containing a polyphenylene ether and a polystyrene-based polymer having a syndiotactic structure.

<4> The optically anisotropic layered body according to <3>, wherein a weight ratio of the polyphenylene ether relative to the polystyrene-based polymer having a syndiotactic structure is 35/65 or more and 45/55 or less.

<5> A circular polarizing plate comprising a polarizer, and the optically anisotropic layered body according to any one of <1> to <4>, wherein the circular polarizing plate includes the polarizer, the first optically anisotropic layer, and the second optically anisotropic layer in this order.

<6> The circular polarizing plate according to <5>, wherein an angle θ1 formed by a polarized light absorption axis direction of the polarizer and a direction that gives a maximum refractive index nx1 in the plane of the first optically anisotropic layer satisfies the following formula (9), and an angle θ2 formed by the polarized light absorption axis direction of the polarizer and a direction that gives a maximum refractive index nx2 in the plane of the second optically anisotropic layer satisfies the following formula (10):

$$|\theta 1|=15°\pm 5° \quad (9),$$

$$|\theta 2|=75°\pm 10° \quad (10),$$

where the angles θ1 and θ2 have the same signs.

<7> The circular polarizing plate according to <5>, wherein an angle θ1 formed by a polarized light absorption axis direction of the polarizer and a direction that gives a maximum refractive index nx1 in the plane of the first optically anisotropic layer satisfies the following formula (11), and an angle θ2 formed by the polarized light absorption axis direction of the polarizer and a direction that gives a maximum refractive index nx2 in the plane of the second optically anisotropic layer satisfies the following formula (12):

$$|\theta 1|=75°\pm 5° \quad (11),$$

$$|\theta 2|=15°\pm 10° \quad (12),$$

where the angles θ1 and θ2 have the same signs.

<8> An image display device comprising the circular polarizing plate according to any one of <5> to <7>, and an image display element, wherein the image display device includes the optically anisotropic layered body, the polarizer, and the image display element in this order.

<9> An organic electroluminescent display device comprising the circular polarizing plate according to any one of <5> to <7>, and an organic electroluminescent element, wherein the image display device includes the polarizer, the optically anisotropic layered body, and the organic electroluminescent element in this order.

Advantageous Effects of Invention

According to the present invention, there can be provided: the optically anisotropic layered body capable of reducing change in color tone which occurs when the display surface of the image display device is rotated while the image display device is viewed through polarized sunglasses from the front direction or the tilt direction of the display surface; and the circular polarizing plate and the image display device that include the aforementioned optically anisotropic layered body.

DESCRIPTION OF EMBODIMENTS

Figure 1:
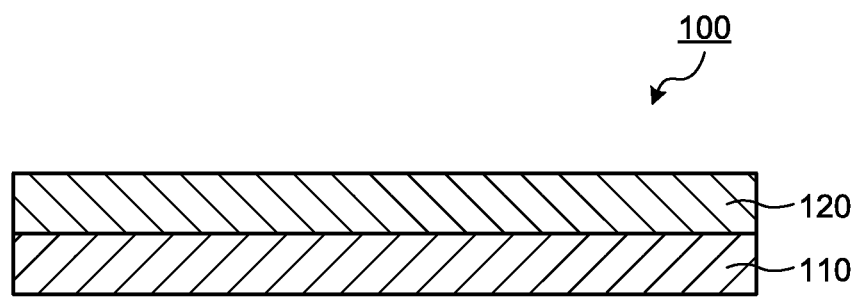
FIG. 1 is a cross-sectional view schematically illustrating an optically anisotropic layered body according to an embodiment of the present invention.

Hereinafter, the present invention will be described in detail with reference to embodiments and examples. However, the present invention is not limited to the following embodiments and examples, and may be freely modified for implementation without departing from the scope of claims of the present invention and the scope of their equivalents.

In the following description, the same element may be denoted by the same reference sign and the description thereof may be omitted.

In the following description, a "long-length" film refers to a film with the length that is 5 times or more the width, and preferably a film with the length that is 10 times or more the width, and specifically refers to a film having a length that allows a film to be wound up into a rolled shape for storage or transportation. The upper limit of the length of the long-length film is not particularly limited, but is 100,000 times or less the width, for example.

In the following description, an in-plane retardation Re of a certain layer is a value represented by $Re=(nx-ny)\times d$ unless otherwise specified. A thickness direction phase difference Rth of a certain layer is a value represented by $Rth=\{(nx+ny)/2-nz\}\times d$ unless otherwise specified. An NZ factor (NZ) of a certain layer is a value represented by $NZ=(nx-nz)/(nx-ny)$ unless otherwise specified.

Herein, nx represents a refractive index in a direction (a slow axis direction) in which the maximum refractive index is given among directions perpendicular to the thickness direction of the layer (in-plane directions), ny represents a refractive index in a direction, among the above-mentioned in-plane directions of the layer, orthogonal to the direction giving nx, nz represents a refractive index in the thickness direction of the layer, and d represents the thickness of the layer. The measurement wavelength is 590 nm unless otherwise specified.

In the following description, a slow axis of a certain layer represents a slow axis in the plane of the layer, unless otherwise specified.

In the following description, a front direction of a certain surface means the normal direction of the surface, specifically, a direction at the polar angle 0° and the azimuth angle 0° of the surface, unless otherwise specified.

In the following description, a tilt direction of a certain surface means a direction which is neither parallel nor perpendicular to the surface, specifically, in the direction in a polar angle range of larger than 0° and smaller than 90° of the surface, unless otherwise specified.

In the following description, a direction of an element being "parallel", "perpendicular" or "orthogonal" may allow an error within the range of not impairing the advantageous effects of the present invention, for example, within a range of ±5°, unless otherwise specified.

In the following description, a lengthwise direction of a long-length film is usually in parallel with a film flow direction in the production line.

In the following description, a "circular polarizing plate", a "phase difference plate", a "λ/2 plate", and a "λ/4 plate" are not only a rigid member, but also, for example, a flexible member like a resin film, unless otherwise specified.

In the following description, an angle formed by an optical axis (polarized light absorption axis, polarized light transmission axis, slow axis, etc.) of each layer in a member including a plurality of layers represents an angle when the layer is viewed from the thickness direction, unless otherwise specified.

In the following description, the term "(meth)acrylate" is a term encompassing "acrylate", "methacrylate", and mixtures thereof, and "(meth)acrylic" is a term encompassing "acrylic", "methacrylic", and combinations thereof, unless otherwise specified.

In the following description, "a polymer having a positive intrinsic birefringence value" and "a resin having a positive intrinsic birefringence value" mean "a polymer in which the refractive index in the stretching direction becomes larger than the refractive index in the direction orthogonal thereto" and "a resin in which the refractive index in the stretching direction becomes larger than the refractive index in the direction orthogonal thereto", respectively. In addition, "a polymer having a negative intrinsic birefringence value" and "a resin having a negative intrinsic birefringence value" mean "a polymer in which the refractive index in the stretching direction becomes smaller than the refractive index in the direction orthogonal thereto" and "a resin in which the refractive index in the stretching direction becomes smaller than the refractive index in the direction orthogonal thereto", respectively. The intrinsic birefringence value may be calculated from the permittivity distribution.

In the following description, an adhesive encompasses not only an adhesive in a narrow sense (an adhesive having a shear storage elastic modulus at 23° C. of 1 MPa to 500 MPa after being irradiated with energy rays or after being heat-treated) but also a tackiness agent adhesive having a shear storage elastic modulus at 23° C. of less than 1 MPa, unless otherwise stated.

[1. Summary of Optically Anisotropic Layered Body]

An optically anisotropic layered body of the present invention includes a first optically anisotropic layer and a second optically anisotropic layer.

Herein, the first optically anisotropic layer satisfies the following formula (1), formula (2), formula (3), and formula (4). The second optically anisotropic layer 120 satisfies the following formula (5), formula (6), formula (7), and formula (8).

FIG. 1 is a cross-sectional view schematically illustrating an optically anisotropic layered body 100 according to an embodiment of the present invention. The optically anisotropic layered body 100 includes the first optically anisotropic layer 110 and the second optically anisotropic layer 120.

[1-1. Optical Properties of First Optically Anisotropic Layer and Second Optically Anisotropic Layer]

The first optically anisotropic layer 110 satisfies the following formula (1), formula (2), formula (3), and formula (4).

$$220 \text{ nm} < Re1(590) < 330 \text{ nm} \tag{1}$$

$$Re1(450)/Re1(550) \leq 1.0 \tag{2}$$

$$Re1(650)/Re1(550) \geq 1.0 \tag{3}$$

$$0.95 < NZ1 < 2.00 \tag{4}$$

In the formulae, Re1(450), Re1(550), Re1(590), and Re1(650) represent the in-plane retardations Re of the first optically anisotropic layer at wavelengths of 450 nm, 550 nm, 590 nm, and 650 nm, respectively, and NZ1 represents the NZ factor of the first optically anisotropic layer at a wavelength of 590 nm.

The second optically anisotropic layer 120 satisfies the following formula (5), formula (6), formula (7), and formula (8).

$$110 \text{ nm} < Re2(590) < 165 \text{ nm} \tag{5}$$

$$Re2(450)/Re2(550) \leq 1.0 \tag{6}$$

$$Re2(650)/Re2(550) \geq 1.0 \tag{7}$$

$$-1.5 \leq NZ2 \leq 0.00 \tag{8}$$

In the formulae, Re2(450), Re2(550), Re2(590), and Re2(650) represent the in-plane retardations Re of the second optically anisotropic layer at wavelengths of 450 nm, 550 nm, 590 nm, and 650 nm, respectively, and NZ2 represents the NZ factor of the first optically anisotropic layer at a wavelength of 590 nm.

As the optically anisotropic layered body includes the first optically anisotropic layer satisfying the aforementioned formulae (1) to (4) and the second optically anisotropic layer satisfying the aforementioned formulae (5) to (8), the optically anisotropic layered body can reduce a change in a color tone of a display surface of an image display device including the optically anisotropic layered body which occurs when the display surface is rotated while the image display device is viewed through polarized sunglasses from a front direction or a tilt direction of the display surface. Further, when the circular polarizing plate obtained by combining the aforementioned optically anisotropic layered body and a polarizer is provided in an organic EL display device, reflection of external light occurring on a display surface of the organic EL display device in its front direction or tilt direction can usually be suppressed.

In the formula (1), Re1(590) is preferably 258 nm or more, more preferably 268 nm or more, and particularly preferably 273 nm or more, and is preferably 288 nm or less, and more preferably 283 nm or less. When Re1(590) falls within such a range, change in the color tone on the display surface can be further reduced.

In the formula (2), an in-plane retardation ratio Re1(450)/Re1(550) is preferably 0.80 or more, and is preferably 0.95 or less, and more preferably 0.90 or less. When the ratio Re1(450)/Re1(550) falls within such a range, change in the color tone on the display surface can be further reduced.

In the formula (3), an in-plane retardation ratio Re1(650)/Re1(550) is preferably 1.01 or more, and more preferably 1.02 or more, and is preferably 1.20 or less. When the ratio Re1(650)/Re1(550) falls within such a range, change in the color tone on the display surface can be further reduced.

In the formula (4), the NZ factor NZ1 is preferably 1.0 or more, and is preferably 1.5 or less, and more preferably 1.2 or less. When NZ1 falls within such a range, change in the color tone on the display surface can be further reduced.

In the formula (5), Re2(590) is preferably 129 nm or more, and more preferably 134 nm or more, and is preferably 144 nm or less, and more preferably 142 nm or less. When Re2(590) falls within such a range, change in the color tone on the display surface can be further reduced.

In the formula (6), an in-plane retardation ratio Re2(450)/Re2(550) is preferably 0.80 or more, and is preferably 0.95 or less, and more preferably 0.90 or less. When the ratio Re2(450)/Re2(550) falls within such a range, change in the color tone on the display surface can be further reduced.

In the formula (7), an in-plane retardation ratio Re2(650)/Re2(550) is preferably 1.01 or more, and more preferably 1.02 or more, and is preferably 1.20 or less. When the ratio Re2(650)/Re2(550) falls within such a range, change in the color tone on the display surface can be further reduced.

In the formula (8), the NZ factor NZ2 is preferably −1.0 or more, more preferably −0.75 or more, and particularly preferably −0.70 or more, and is preferably 0.0 or less, more preferably −0.25 or less, and particularly preferably −0.30 or less. When the NZ2 falls within such a range, change in the color tone on the display surface can be further reduced.

A difference |Re1(450)/Re1(550)−Re2(450)/Re2(550)| between the in-plane retardation ratio Re1(450)/Re1(550) of the first optically anisotropic layer and the in-plane retardation ratio Re2(450)/Re2(550) of the second optically anisotropic layer is preferably 0.09 or less, further preferably 0.05 or less, more preferably 0.001 or less, and ideally 0.000. When the difference of the in-plane retardation ratios |Re1(450)/Re1(550)−Re2(450)/Re2(550)| takes the aforementioned value, change in the color tone on the display surface can be further reduced.

A difference |Re1(650)/Re1(550)−Re2(650)/Re2(550)| between the in-plane retardation ratio Re1(650)/Re1(550) of the first optically anisotropic layer and the in-plane retardation ratio Re2(650)/Re2(550) of the second optically anisotropic layer is preferably 0.04 or less, further preferably 0.02 or less, more preferably 0.001 or less, and ideally 0.000. When the difference of the in-plane retardation ratios |Re1(650)/Re1(550)−Re2(650)/Re2(550)| takes the aforementioned value, change in the color tone on the display surface can be further reduced.

[1-2. Relation Between First Optically Anisotropic Layer and Second Optically Anisotropic Layer]

Figure 2:
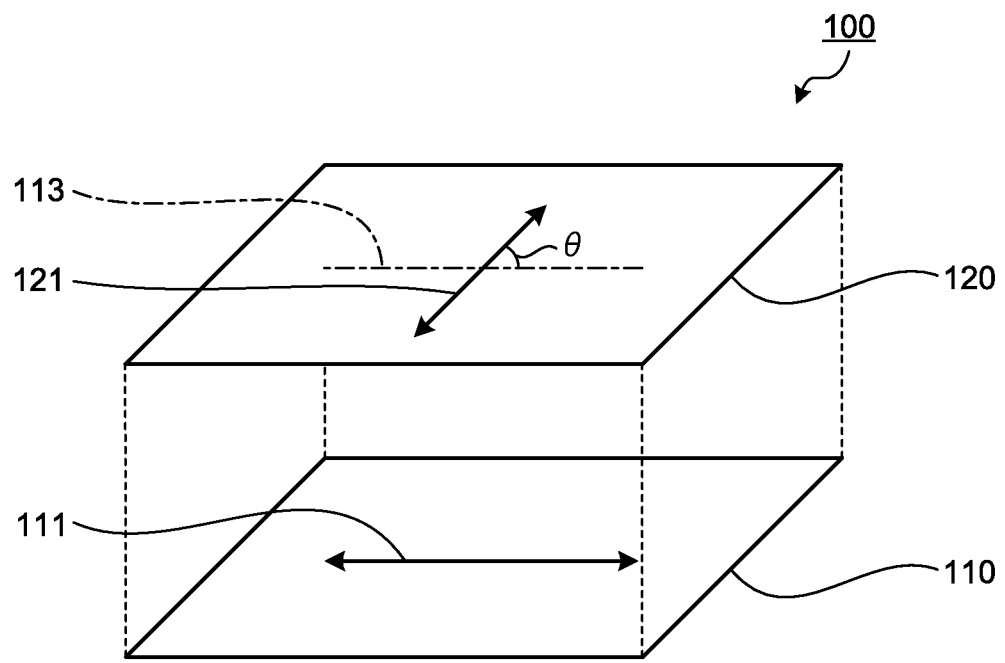
FIG. 2 is an exploded perspective view of the optically anisotropic layered body according to an embodiment of the present invention.

FIG. 2 is an exploded perspective view of the optically anisotropic layered body 100 according to an embodiment of the present invention. The first optically anisotropic layer 110 has a slow axis 111 in a direction parallel to the in-plane direction and the second optically anisotropic layer 120 has a slow axis 121 in a direction parallel to the in-plane direction. A line segment 113 shown by a dash-dot line is parallel to the slow axis 111 and present on the surface of the second optically anisotropic layer 120. An angle θ is an angle formed by the slow axis 111 and the slow axis 121.

The slow axis 111 is a direction that gives the maximum refractive index nx1 in the plane of the first optically anisotropic layer 110 and the slow axis 121 is a direction that gives the maximum refractive index nx2 in the plane of the second optically anisotropic layer 120.

The angle θ is preferably 60°±10° (that is, (60°-10°) or more and (60°+10°) or less). When the angle formed by the slow axis 111 and the slow axis 121 falls within this range, linearly polarized light in a wider wavelength range can be converted to circularly polarized light by the optically anisotropic layered body 100. Thus, the change in the color tone on the display surface can be further reduced.

The angle θ is more preferably 60°±5° and further preferably 60°±3°. When the angle θ falls within this range, linearly polarized light in a wide wavelength range can be further effectively converted to circularly polarized light by the optically anisotropic layered body 100. Thus, the change in the color tone on the display surface can be further reduced.

[1-3. Configurations of First Optically Anisotropic Layer and Second Optically Anisotropic Layer]

Examples of the materials for forming the first optically anisotropic layer and the second optically anisotropic layer may include resins. Of these, a thermoplastic resin is preferable.

The material for forming the first optical anisotropic layer and the second optical anisotropic layer may be a resin containing a polymer having a positive intrinsic birefringence value, a resin containing a polymer having a negative intrinsic birefringence value, or a resin containing a polymer having a positive intrinsic birefringence value and a polymer having a negative intrinsic birefringence value.

Examples of the polymer having a positive intrinsic birefringence value may include, but are not particularly limited to, polyolefin such as polyethylene and polypropylene; polyester such as polyethylene terephthalate and polybutylene terephthalate; polyarylene sulfide such as polyphenylene sulfide; polyvinyl alcohol; polycarbonate; polyarylate; a cellulose ester polymer, polyether sulfone; polysulfone; polyarylsulfone; polyvinyl chloride; a cyclic olefin polymer such as a norbornene polymer; and a rod-like liquid crystal polymer.

Examples of the polymer having a negative intrinsic birefringence value may include, but are not particularly limited to, a homopolymer of a styrene compound and a polystyrene-based polymer containing a copolymer of a styrene compound and an optional monomer; a polyacrylonitrile polymer; a polymethylmethacrylate polymer; and a multicomponent copolymer thereof. Examples of the optional monomer which is capable of being copolymerized with a styrene compound may include acrylonitrile, maleic anhydride, methyl methacrylate, and butadiene, and one or more selected from acrylonitrile, maleic anhydride, methyl methacrylate, and butadiene are preferable.

The aforementioned polymer may be a homopolymer or a copolymer.

As the aforementioned polymers, one type thereof may be solely used, and two or more types thereof may also be used in combination at any ratio.

Since the refractive index in the thickness direction can be increased, the second optically anisotropic layer preferably includes a resin containing a polymer having a negative intrinsic birefringence value, more preferably includes a resin containing a polyphenylene ether and a polystyrene-based polymer having a syndiotactic structure, and further more preferably includes a layer formed of a resin containing a polyphenylene ether and a polystyrene-based polymer having a syndiotactic structure. Hereinafter, a "resin containing a polyphenylene ether and a polystyrene-based polymer having a syndiotactic structure" may be referred to as a "blend resin p1" as appropriate.

The signs (positive/negative) of the intrinsic birefringence value of the blend resin p1 may be adjusted according to the type and amount of the polymer contained in the blend resin p1. Usually, a resin having a negative intrinsic birefringence value is used as the blend resin p1. As to the blend resin p1, the wavelength distribution of the blend resin p1 can be adjusted with a high degree of freedom by adjusting the amount ratio of the polyphenylene ether and the polystyrene-based polymer.

The polyphenylene ether is usually a polymer having a positive intrinsic birefringence value. The polyphenylene ether includes a structural unit having a structure formed by polymerizing a phenyl ether or a phenyl ether derivative. Usually, a polymer having a structural unit having a phenylene ether skeleton in its main chain is used as the polyphenylene ether. Hereinafter, the "structural unit having a phenylene ether skeleton" is referred to as a "phenylene ether unit" as appropriate. However, the benzene ring in the phenylene ether unit may have a substituent as long as the advantageous effects of the present invention are not significantly impaired.

Of these, as the polyphenylene ether, a polymer containing a phenylene ether unit represented by the following formula (I) is preferable.

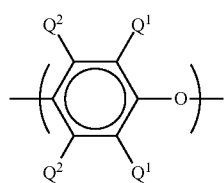

(I)

In the formula (I), $Q^1$'s each independently represent a halogen atom, a lower alkyl group (for example, an alkyl group of 7 or less carbon atoms), a phenyl group, a haloalkyl group, an aminoalkyl group, a hydrocarbon oxy group, or a halohydrocarbon oxy group (a group where at least two carbon atoms separate the halogen atom and the oxygen atom). Of these, as $Q^1$, an alkyl group and a phenyl group are preferable, and in particular, an alkyl group of 1 to 4 carbons is more preferable.

In the formula (I), $Q^2$'s each independently represent a hydrogen atom, a halogen atom, a lower alkyl group (for example, an alkyl group of 7 or less carbon atoms), a phenyl group, a haloalkyl group, a hydrocarbon oxy group, or a halohydrocarbon oxy group (a group where at least two carbon atoms separate the halogen atom and the oxygen atom). Of these, a hydrogen atom is preferable as $Q^2$.

The polyphenylene ether may be a homopolymer having one type of structural unit, and may also be a copolymer having two or more types of structural units.

When the polymer containing the structural unit represented by the formula (I) is a homopolymer, preferable examples of the homopolymer may include a homopolymer having a 2,6-dimethyl-1,4-phenylene ether unit (a structural unit represented by "—($C_6H_2(CH_3)_2$—O)—").

When the polymer containing the structural unit represented by the formula (I) is a copolymer, preferable examples of the copolymer may include a random copolymer having a 2,6-dimethyl-1,4-phenylene ether unit and a 2,3,6-trimethyl-1,4-phenylene ether unit (a structural unit represented by "—($C_6H(CH_3)_3$—O—)—") in combination.

The polyphenylene ether may contain any structural unit other than the phenylene ether unit. In this case, the polyphenylene ether is a copolymer having the phenylene ether unit and an optional structural unit. However, it is preferable that the amount of the optional structural unit in the polyphenylene ether is such a small amount that the advantageous effects of the present invention are not significantly impaired. Specifically, the amount of the phenylene ether unit in the polyphenylene ether is preferably 50% by weight or more, more preferably 70% by weight or more, and particularly preferably 80% by weight or more.

As the polyphenylene ether, one type thereof may be solely used, and two or more types thereof may also be used in combination at any ratio.

The weight-average molecular weight of the polyphenylene ether is preferably 15,000 or more, more preferably 25,000 or more, and particularly preferably 35,000 or more, and is preferably 100,000 or less, more preferably 85,000 or less, and particularly preferably 70,000 or less. By setting the weight-average molecular weight to be equal to or higher than the lower limit value of the aforementioned range, strength of the layer formed of the blend resin p1 can be increased. By setting the weight-average molecular weight to the upper limit value or less, dispersibility of the polyphenylene ether can be enhanced, and it is thereby possible to uniformly mix the polyphenylene ether and the polystyrene-based polymer at a high level.

Herein, as the weight-average molecular weight, a standard polystyrene-equivalent value measured by gel permeation chromatography (GPC) at a temperature of 135° C. using 1,2,4-trichlorobenzene as a solvent may be employed.

There is no limitation on the method for producing the polyphenylene ether, and the polyphenylene ether may be produced by a publicly known method.

The polystyrene-based polymer having a syndiotactic structure is usually a polymer having a negative intrinsic birefringence value. The polystyrene-based polymer contains a structural unit formed by polymerizing a styrene compound. Hereinafter, the "structural unit formed by polymerizing a styrene compound" is referred to as a "styrene unit" as appropriate. Examples of the styrene compounds may include styrene and a styrene derivative. Examples of the styrene derivatives may include derivatives obtained by substitution on the benzene ring or at α position of styrene with a substituent.

Specific examples of the styrene compound may include styrene; an alkylstyrene such as methylstyrene and 2,4-dimethylstyrene; a halogenated styrene such as chlorostyrene; a halogen substituted alkylstyrene such as chloromethylstyrene; and an alkoxystyrene such as methoxystyrene. Of these, styrene having no substituent is preferable as the styrene compound. As the styrene compound, one type thereof may be solely used, and two or more types thereof may also be used in combination at any ratio.

As the polystyrene-based polymer contained in the blend resin p1, a polystyrene-based polymer having a syndiotactic structure is used. Herein, that "the polystyrene polymer has a syndiotactic structure" means that the stereochemical structure of the polystyrene-based polymer is a syndiotactic structure. The syndiotactic structure refers to a three-dimensional structure in which phenyl groups, which are side chains, are alternately positioned in opposite directions with respect to a main chain formed by a carbon-carbon bond in the Fisher projection formula.

The tacticity (stereoregularity) of the polystyrene-based polymer may be quantified by a nuclear magnetic resonance method ($^{13}$C-NMR method) with isotopic carbon. Tacticity, as measured by the $^{13}$C-NMR method, may be expressed in terms of the proportion of the presence of a plurality of consecutive structural units. Generally, for example, two consecutive structural units constitute a diad, three consecutive structural units constitute a triad, and five consecutive structural units constitute a pentad. In this case, the polystyrene-based polymer having the syndiotactic structure means a polymer having a syndiotacticity of preferably 75% or more, more preferably 85% or more as the racemic diad, or a polymer having a syndiotacticity of preferably 30% or more, more preferably 50% or more as the racemic pentad.

Examples of the polystyrene-based polymer may include polystyrene, poly(alkylstyrene), poly(halogenated styrene), poly(halogenated alkylstyrene), poly(alkoxystyrene), poly(vinylbenzoic acid ester), and hydrogenated polymers thereof, and copolymers thereof.

Examples of the poly(alkylstyrene) may include poly(methylstyrene), poly(ethylstyrene), poly(isopropylstyrene), poly(t-butylstyrene), poly(phenylstyrene), poly(vinylnaphthalene), and poly(vinylstyrene).

Examples of the poly(halogenated styrene) may include poly(chlorostyrene), poly(bromostyrene), and poly(fluorostyrene).

Examples of the poly(halogenated alkylstyrene) may include poly(chloromethylstyrene).

Examples of the poly(alkoxystyrene) may include poly(methoxystyrene) and poly(ethoxystyrene).

Particularly preferable examples of the polystyrene-based polymer may include polystyrene, poly(p-methylstyrene), poly(m-methylstyrene), poly(p-t-butylstyrene), poly(p-chlorostyrene), poly(m-chlorostyrene), poly(p-fluorostyrene), hydrogenated polystyrene, and copolymers containing these structural units.

The polystyrene-based polymer may be a homopolymer having only one type of structural unit, and may also be a copolymer having two or more types of structural units. When the polystyrene-based polymer is a copolymer, it may be a copolymer containing two or more types of styrene units, and may also be a copolymer containing a styrene unit and a structural unit other than the styrene unit. However, when the polystyrene-based polymer is a copolymer containing a styrene unit and a structural unit other than the styrene unit, it is preferable that the amount of the structural unit other than the styrene unit in the polystyrene-based polymer is such a small amount that the advantageous effects of the present invention are not significantly impaired. Specifically, the amount of the styrene unit in the polystyrene-based polymer is preferably 80% by weight or more, more preferably 83% by weight or more, and particularly preferably 85% by weight or more. Usually, by setting the amount of the styrene unit in such a range, a desired phase difference can be easily expressed in the layer formed of the blend resin p1.

As the polystyrene-based polymer, one type thereof may be solely used, and two or more types thereof may also be used in combination at any ratio.

The weight-average molecular weight of the polystyrene-based polymer is usually 130,000 or more, preferably 140,000 or more, and more preferably 150,000 or more, and is usually 300,000 or less, preferably 270,000 or less, and more preferably 250,000 or less. When the weight-average molecular weight is set as described above, the glass transition temperature of the polystyrene-based polymer is increased, and heat resistance of the layer formed of the blend resin p1 can be stably improved.

The glass transition temperature of the polystyrene-based polymer is preferably 85° C. or higher, more preferably 90° C. or higher, and particularly preferably 95° C. or higher. By increasing the glass transition temperature of the polystyrene-based polymer in this manner, the glass transition temperature of the blend resin p1 can be effectively increased, and thus heat resistance of the layer formed of the blend resin p1 can be stably improved. From the viewpoint of stably and easily producing the layer formed of the blend resin p1, the glass transition temperature of the polystyrene-based polymer is preferably 160° C. or lower, more preferably 155° C. or lower, and particularly preferably 150° C. or lower.

The polystyrene-based polymer having a syndiotactic structure may be produced by a publicly known method, for example, by polymerizing a styrene compound in an inert hydrocarbon solvent or in the absence of a solvent, using a titanium compound and a condensation product of water and trialkylaluminum as a catalyst.

The polyphenylene ether and the polystyrene-based polymer contained in the blend resin p1 are (i) different in wavelength distribution from each other, (ii) different in sign of the intrinsic birefringence value, and (iii) compatible with each other. Therefore, by adjusting the weight ratio between the amount of the polyphenylene ether and the amount of the polystyrene-based polymer, the wavelength distribution of the layer formed of the blend resin p1 can be adjusted. The weight ratio of the polyphenylene ether relative to the polystyrene-based polymer ("amount of polyphenylene ether"/"amount of polystyrene-based polymer") is preferably 35/65 or more, and more preferably 37/63 or more, and is preferably 45/55 or less, and more preferably 43/57 or less. By setting the weight ratio of the polyphenylene ether relative to the polystyrene-based polymer in the aforementioned range, the layer formed of the blend resin p1 can exhibit a preferable reverse wavelength distribution property.

The ratio of the sum of the polyphenylene ether and the polystyrene-based polymer in the blend resin p1 is preferably 50% by weight to 100% by weight, more preferably 70% by weight to 100% by weight, and particularly preferably 90% by weight to 100% by weight. By setting the ratio of the sum of the polyphenylene ether and the polystyrene-based polymer in the aforementioned range, the layer formed of the blend resin p1 can exhibit appropriate optical properties.

The blend resin p1 may contain an optional component other than the polyphenylene ether and the polystyrene-based polymer.

For example, the blend resin p1 may contain a polymer other than the above-mentioned polyphenylene ether and polystyrene-based polymer. The amount of the polymer other than the polyphenylene ether and the polystyrene-based polymer is preferably 15 parts by weight or less, more preferably 10 parts by weight or less, and particularly preferably 5 parts by weight or less, relative to 100 parts by weight of the total amount of the polyphenylene ether and the polystyrene-based polymer.

For example, the blend resin p1 may contain a blending agent. Examples of the blending agents may include a layered crystalline compound; fine particles; a stabilizer such as an antioxidant, a thermal stabilizer, a light stabilizer, a weather stabilizer, an ultraviolet absorber, and a near-infrared absorber; a plasticizer: a colorant such as a dye and a pigment; and an antistatic agent. As the blending agents, one type thereof may be solely used, and two or more types thereof may also be used in combination at any ratio.

The amount of the blending agent may be appropriately determined within a range that does not significantly impair the advantageous effects of the present invention. For example, the amount of the blending agent may be such an amount that the total light transmittance of the layer formed of the blend resin p1 can be maintained at 85% or more.

Of these described above, an ultraviolet absorber is preferable as the blending agent from the viewpoint of improving weather resistance.

Examples of the ultraviolet absorber may include an oxybenzophenone-based compound, a benzotriazole-based compound, a salicylic acid ester-based compound, a benzophenone-based ultraviolet absorber, a benzotriazole-based ultraviolet absorber, an acrylonitrile-based ultraviolet absorber, a triazine-based compound, a nickel complex salt-based compound, and an inorganic powder. Examples of suitable ultraviolet absorbers may include 2,2'-methylenebis(4-(1,1,3,3-tetramethylbutyl)-6-(2H-benzotriazol-2-yl)phenol), 2-(2'-hydroxy-3'-tert-butyl-5'-methylphenyl)-5-chlorobenzotriazole, 2,4-di-tert-butyl-6-(5-chlorobenzotriazol-2-yl)phenol, 2,2'-dihydroxy-4,4'-dimethoxybenzophenone, and 2,2',4,4'-tetrahydroxybenzophenone, and 2,2'-methylenebis(4-(1,1,3,3-tetramethylbutyl)-6-(2H-benzotriazol-2-yl)phenol) is particularly preferable.

The glass transition temperature of the blend resin p1 is preferably 115° C. or higher, more preferably 118° C. or higher, and even more preferably 120° C. or higher. Since the blend resin p1 contains a combination of the polyphenylene ether and the polystyrene-based polymer, the glass transition temperature can be increased as compared to a resin containing only the polystyrene-based polymer. Since the orientation relaxation of the blend resin p1 can be reduced by such a high glass transition temperature, the second optically anisotropic layer having excellent heat resistance can be realized. The upper limit of the glass transition temperature of the blend resin p1 is not particularly limited, but is usually 200° C. or lower.

It is preferable that the first optically anisotropic layer and the second optically anisotropic layer are produced from a stretched film obtained by stretching a pre-stretch film formed of a resin because thereby they can be easily made to have a large area and can be produced efficiently. Each of the first optically anisotropic layer and the second optically anisotropic layer may have a single layer structure, and may also have a multilayer structure including two or more types of layers. Preferably, each of the first optically anisotropic layer and the second optically anisotropic layer has a single layer structure.

The optical properties of the first optically anisotropic layer and the second optically anisotropic layer can be adjusted by, for example, changing the type of resin contained in the layer, changing the ratio of structural units included in the polymer contained in the resin, and changing the conditions for the stretching of the pre-stretch film.

The slow axis direction along which the maximum refractive index in the plane of the first optically anisotropic layer is shown may be optionally set in accordance with the use application of the optically anisotropic layered body. When the optically anisotropic layered body has a long-length shape, the angle formed by the slow axis of the first optically anisotropic layer and the widthwise direction of the optically anisotropic layered body is preferably greater than 0° and less than 90°. Also, in a certain embodiment, the angle formed by the slow axis of the first optically anisotropic layer and the widthwise direction of the optically anisotropic layered body may be in a specific range, preferably 15°±5°, 22.5°±5°, 45°±5°, 67.5°±5°, or 75°±5°, more preferably 15°±4°, 22.5°±4°, 45°±4°, 67.5°±4°, or 75°±4°, and even more preferably 15°±3°, 22.5°±3°, 45°±3°, 67.5°±3°, or 75°±3°. By having such an angular relationship, the optically anisotropic layered body can serve as a material that enables efficient production of a circular polarizing plate.

The slow axis direction indicating the maximum refractive index in the plane of the second optically anisotropic layer may be optionally set in accordance with the use application of the optically anisotropic layered body. When the optically anisotropic layered body has a long-length shape, the angle formed by the slow axis of the second optically anisotropic layer and the widthwise direction of the optically anisotropic layered body is preferably greater than 0° and less than 90°. Also, in a certain embodiment, the angle formed by the slow axis of the second optically anisotropic layer and the widthwise direction of the optically anisotropic layered body may be in a specific range, preferably 15°±5°, 22.5°+5°, 45°+5°, 67.5°±5°, or 75°±5°, more preferably 15°±4°, 22.5°±4°, 45°±4°, 67.5°±4°, or 75°±4°, and even more preferably 15°±3°, 22.5°±3°, 45±3°, 67.5°±3°, or 75°±3°. By having such an angular relationship, the optically anisotropic layered body can serve as a material that enables efficient production of a circular polarizing plate.

The thicknesses of the first optically anisotropic layer and the second optically anisotropic layer are not particularly limited, and can be appropriately adjusted so that the optical properties of the respective layers fall within desired ranges.

The specific thickness of the first optically anisotropic layer is preferably 0.5 μm or more, and more preferably 1.0 μm or more, and is preferably 100 μm or less, more preferably 80 μm or less, and particularly preferably 60 μm or less.

The specific thickness of the second optically anisotropic layer is preferably 0.5 μm or more, and more preferably 1.0 μm or more, and is preferably 100 μm or less, more preferably 80 μm or less, and particularly preferably 60 μm or less.

[1-4. Optional Layer Optically Anisotropic Layer May Include]

The optically anisotropic layered body of the present invention may include an optional layer other than the first optically anisotropic layer and the second optically anisotropic layer.

The optional layer that may be included in the optically anisotropic layered body of the present invention is not particularly limited, and examples thereof may include an adhesive layer and a hard coat layer. The optically anisotropic layered body may include only one layer of these optional layers, or may include a plurality of layers.

[1-5. Method for Producing Optically Anisotropic Layered Body]

The optically anisotropic layered body may be produced by a production method including bonding of a first optically anisotropic layer and a second optically anisotropic layer.

For the bonding of the first optically anisotropic layer and the second optically anisotropic layer, an appropriate adhesive may be used.

As the adhesive, it is preferable to use adhesives similar to that used in a circular polarizing plate which will be described later.

[2. Circular Polarizing Plate]

The circular polarizing plate of the present invention includes a polarizer and the optically anisotropic layered body.

Figure 3:
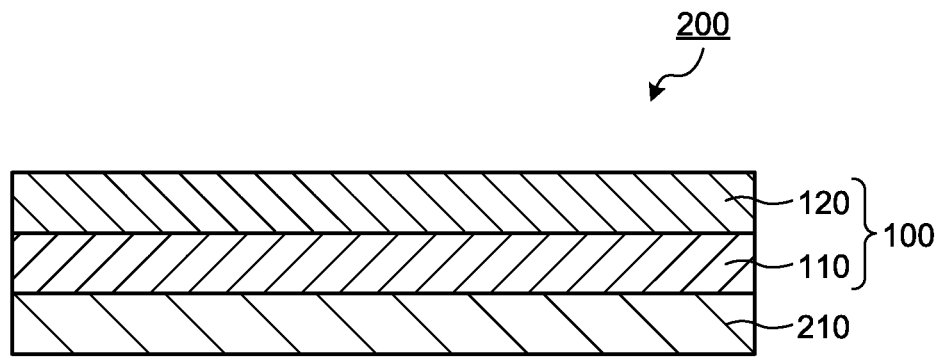
FIG. 3 is a cross-sectional view schematically illustrating a circular polarizing plate according to an embodiment of the present invention.

FIG. 3 is a cross-sectional view schematically illustrating the circular polarizing plate according to an embodiment of the present invention.

A circular polarizing plate 200 includes a polarizer 210 and the optically anisotropic layered body 100. Further, this circular polarizing plate 200 includes the polarizer 210, the first optically anisotropic layer 110, and the second optically anisotropic layer 120 in this order.

As the polarizer 210, a known polarizer used in a device such as a liquid crystal display device and other optical devices may be used.

Examples of the polarizer 210 may include: a film obtained by allowing a polyvinyl alcohol film to absorb iodine or a dichroic dye and then uniaxially stretching the film in a boric acid bath; and a film obtained by allowing a polyvinyl alcohol film to absorb iodine or a dichroic dye, stretching the film, and then further modifying a part of polyvinyl alcohol units in the molecular chain into polyvinylene units. Further, other examples of the polarizer 210 may include a polarizer having a function of separating polarized light into reflected light and transmitted light such as a grid polarizer, a multilayer polarizer, and a cholesteric liquid crystal polarizer. Of these, as the polarizer 210, the polarizer containing the polyvinyl alcohol is preferable.

The polarizer 210 may be a long-length film. In a case where the polarizer 210 is a long-length film, a polarized light absorption axis of the polarizer 210 is parallel or perpendicular to the widthwise direction of the polarizer 210. Such a long-length polarizer 210 may be bonded to the aforementioned optically anisotropic layered body 100 by a roll-to-roll process, to thereby easily produce the long-length circular polarizing plate 200.

When natural light is made incident on the polarizer 210, only one component of polarized light passes therethrough. The polarization degree of this polarizer 210 is not particularly limited, but it is preferably 98% or more, and more preferably 99% or more.

Further, the thickness of the polarizer 210 is preferably 5 µm to 80 µm.

Figure 4:
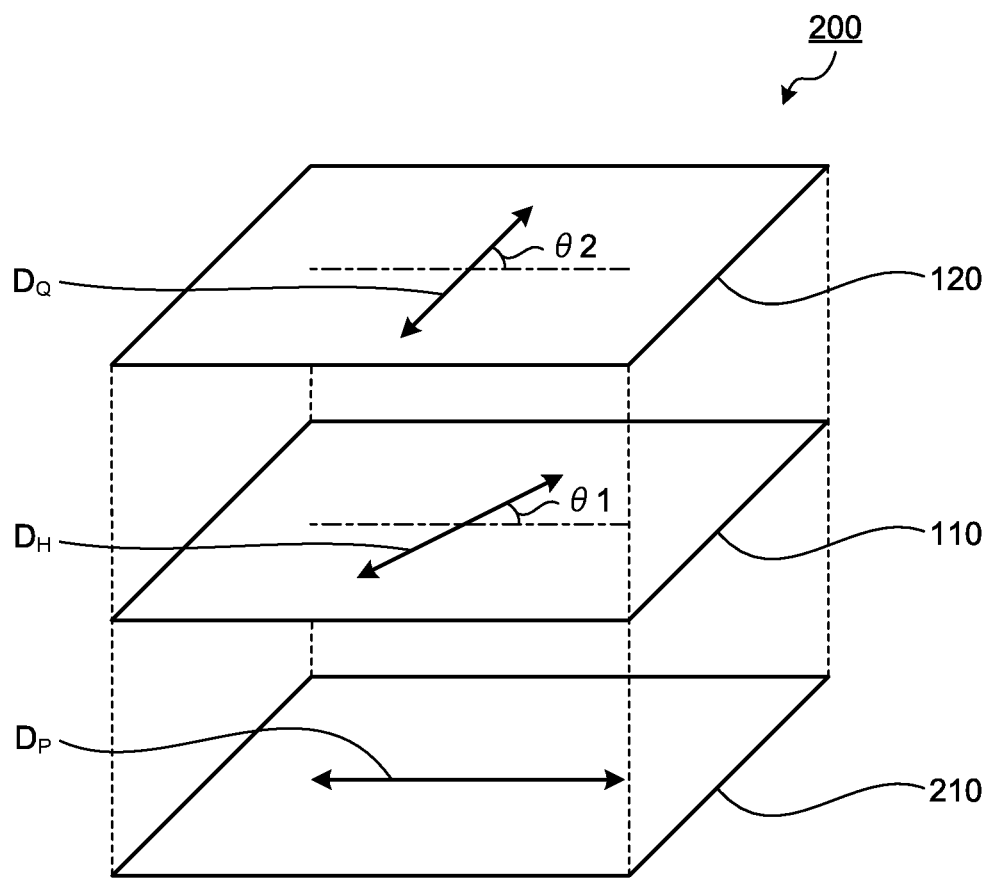
FIG. 4 is an exploded perspective view of the circular polarizing plate according to an embodiment of the present invention.

FIG. 4 is an exploded perspective view of the circular polarizing plate 200 according to an embodiment of the present invention.

As shown in FIG. 4, an angle formed by a polarized light absorption axis direction $D_P$ of the polarizer 210 and a slow axis direction $D_H$ in the plane of the first optically anisotropic layer 110 is represented by a reference numeral "θ1" and an angle formed by the polarized light absorption axis direction $D_P$ of the polarizer 210 and a slow axis direction $D_Q$ in the plane of the second optically anisotropic layer 120 is represented by a reference numeral "θ2". The angles θ1 and θ2 satisfy −90°<θ1<90° and −90°<θ2<90°, respectively. Further, the slow axis direction $D_P$ is a direction that gives the maximum refractive index nx1 in the plane of the first optically anisotropic layer 110 and the slow axis direction $D_Q$ is a direction that gives the maximum refractive index nx2 in the plane of the second optically anisotropic layer 120.

In this case, it is preferable that the aforementioned angles θ1 and θ2 have the same positive or negative signs and satisfy the following formulae (9) and (10)

$$|θ1|=15°±5° \qquad (9)$$

$$|θ2|=75°±10° \qquad (10)$$

To describe the formula (9) in detail, an absolute value of the angle θ1, |θ1|, is normally 15°±5°, preferably 15°±3°, and more preferably 15°±1°.

To describe the formula (10) in detail, an absolute value of the angle θ2, |θ2|, is normally 75°±10°, preferably 75°±6°, and more preferably 75°±2°.

When such requirements are satisfied, linearly polarized light in a wide wavelength range that has passed through the polarizer 210 can be converted to circularly polarized light by the optically anisotropic layered body 100 including the first optically anisotropic layer 110 and the second optically anisotropic layer 120. Thus, when the circular polarizing plate 200 is provided in the image display device, change in the color tone on the display surface can be further reduced.

Alternatively, it is preferable that the aforementioned angles θ1 and θ2 have the same positive or negative signs and satisfy the following formulae (11) and (12)

$$|θ1|=75°±5° \qquad (11)$$

$$|θ2|=15°±10° \qquad (12)$$

To describe the formula (11) in detail, the absolute value of the angle θ1, |θ1|, is normally 75°±5°, preferably 75°±3°, and more preferably 75°±2°.

To describe the formula (12) in detail, the absolute value of the angle θ2, |θ2|, is normally 15°±10°, preferably 15°±6°, and more preferably 15°±1°.

When such requirements are satisfied, linearly polarized light in a wide wavelength range that has passed through the polarizer 210 can be converted to circularly polarized light by the optically anisotropic layered body 100 including the first optically anisotropic layer 110 and the second optically anisotropic layer 120. Thus, when the circular polarizing plate 200 is provided in the image display device, change in the color tone on the display surface can be further reduced.

In a product according to the present invention (the circular polarizing plate, etc.), angular relationship among directions of in-plane optical axes (a slow axis, a polarized light transmission axis, a polarized light absorption axis, etc.) and geometric directions (a lengthwise direction and a widthwise direction of film, etc.) is determined such that a shift in one direction is defined as positive and a shift in the other direction is defined as negative, and the positive and negative directions are defined in common among constituent elements in the product. For example, in a circular polarizing plate, "the slow axis direction of the first optically anisotropic layer relative to the polarized light absorption axis direction of the polarizer is 15° and the slow axis direction of the second optically anisotropic layer relative to the polarized light absorption axis direction of the polarizer is 75°" represents the following two cases:

In viewing the circular polarizing plate from one surface thereof, the slow axis direction of the first optically anisotropic layer is shifted by 15° clockwise from the polarized light absorption axis direction of the polarizer and the slow axis direction of the second optically anisotropic layer is shifted by 75° clockwise from the polarized light absorption axis direction of the polarizer.

In viewing the circular polarizing plate from one surface thereof, the slow axis direction of the first optically anisotropic layer is shifted by 15° counterclockwise from the polarized light absorption axis direction of the polarizer and the slow axis direction of the second optically anisotropic layer is shifted by 75° counterclockwise from the polarized light absorption axis direction of the polarizer.

The circular polarizing plate 200 may further include an adhesive layer (not shown) for bonding the polarizer 210 and the optically anisotropic layered body 100. As the adhesive layer, a layer of a tackiness agent may be used, however, a layer formed by curing a curable adhesive is preferably used. As the curable adhesive, although a thermosetting adhesive may be used, a photocurable adhesive is preferably used. As the photocurable adhesive, an adhesive containing a polymer or a reactive monomer may be used. Further, the adhesive may include one or more of a solvent, a photopolymerization initiator, other additives, and the like if needed.

The photocurable adhesive is an adhesive which is capable of being cured by radiation of light such as visible light, an ultraviolet ray, and an infrared ray. Of these, the adhesive which is capable of being cured by the ultraviolet ray is preferable because of its simple operation.

In a preferred aspect, the photocurable adhesive contains 50% by weight or more of a (meth)acrylate monomer having a hydroxyl group. In the expression "an adhesive containing a monomer at a certain ratio" used herein, the ratio of the monomer refers to the total ratio of both the monomer that is present remaining as the monomer and the monomer that has already been converted to a part of the polymer by polymerization.

Examples of the (meth)acrylate monomers having a hydroxyl group may include hydroxyalkyl (meth)acrylates such as 4-hydroxybutyl (meth)acrylate, 2-hydroxy-3-phenoxypropyl (meth)acrylate, 2-hydroxyethyl (meth)acrylate, 2-hydroxypropyl (meth)acrylate, 2-hydroxy-3-acryloyloxypropyl methacrylate, 2-hydroxyethyl acrylate, and 2-hydroxypropyl (meth)acrylate. As these monomers, one type thereof may be solely used, and two or more types thereof may also be used in combination at any ratio. When they are used in combination, the containing amount thereof is a ratio of the total amount of them.

Examples of the monomer which may be contained in the photocurable adhesive other than the (meth)acrylate monomer having a hydroxyl group may include a monofunctional or polyfunctional (meth)acrylate monomer that does not have a hydroxyl group, and a compound having one or more epoxy groups per molecule.

The adhesive may further include an optional component within a range in which the advantageous effects of the present invention are not significantly impaired. Examples of the optional component may include a photopolymerization initiator, a crosslinking agent, an inorganic filler, a polymerization inhibitor, a color pigment, a dye, a defoamer, a leveling agent, a dispersant, a light diffusion agent, a plasticizer, an antistatic agent, a surfactant, a non-reactive polymer (an inactive polymer), a viscosity modifier, and a near-infrared ray absorbing material. One type thereof may be solely used, and two or more types thereof may also be used in combination at any ratio.

Examples of the photopolymerization initiator may include a radical initiator and a cationic initiator. Examples of the cationic initiator may include Irgacure 250 (a diaryliodonium salt, manufactured by BASF SE). Examples of the radical initiator may include Irgacure 184, Irgacure 819, and Irgacure 2959 (all manufactured by BASF SE).

The thickness of the adhesive layer is preferably 0.5 μm or more, and more preferably 1 μm or more, and is preferably 30 μm or less, more preferably 20 μm or less, and further preferably 10 μm or less. When the thickness of the adhesive layer falls within the aforementioned range, excellent adhesion can be achieved without deteriorating optical properties of the optically anisotropic layered body.

The circular polarizing plate 200 may further include an optional layer. Examples of the optional layer may include a polarizer protection film layer (not shown). As the polarizer protection film layer, any transparent film layer may be used. In particular, a resin film layer excellent in transparency, mechanical strength, heat stability, moisture blocking properties, and the like is preferable. Examples of such a resin may include an acetate resin such as triacetyl cellulose, a polyester resin, a polyether sulfone resin, a polycarbonate resin, a polyamide resin, a polyimide resin, a linear olefin resin, a cyclic olefin resin, and a (meth)acrylic resin.

Further, examples of the optional layer that may be included in the circular polarizing plate 200 may include a hard coat layer such as a shock resistant polymethacrylate resin layer, a mat layer for improving the slidability of the film, an anti-reflection layer, an anti-fouling layer, and the like.

As each of the aforementioned layers, only one layer may be provided, and two or more layers may also be provided.

The circular polarizing plate 200 may be produced by a production method which includes a step of bonding the polarizer 210 and the optically anisotropic layered body 100.

[3. Image Display Device]

The image display device of the present invention includes an image display element and the circular polarizing plate described above. In the image display device, the circular polarizing plate is usually provided on a viewing side of the image display element. In this case, the orientation of the circular polarizing plate may be set to any direction in accordance with the use application of the circular polarizing plate. Thus, the image display device may include the optically anisotropic layered body, the polarizer, and the image display element in this order. Alternatively, the image display device may also include the polarizer, the optically anisotropic layered body, and the image display element in this order.

There are various types of the image display devices depending on the type of the image display element. Representative examples thereof may include a liquid crystal display device including a liquid crystal cell as the image display element and an organic EL display device including an organic electroluminescent element (hereinafter also appropriately referred to as "organic EL element") as the image display element.

Figure 5:
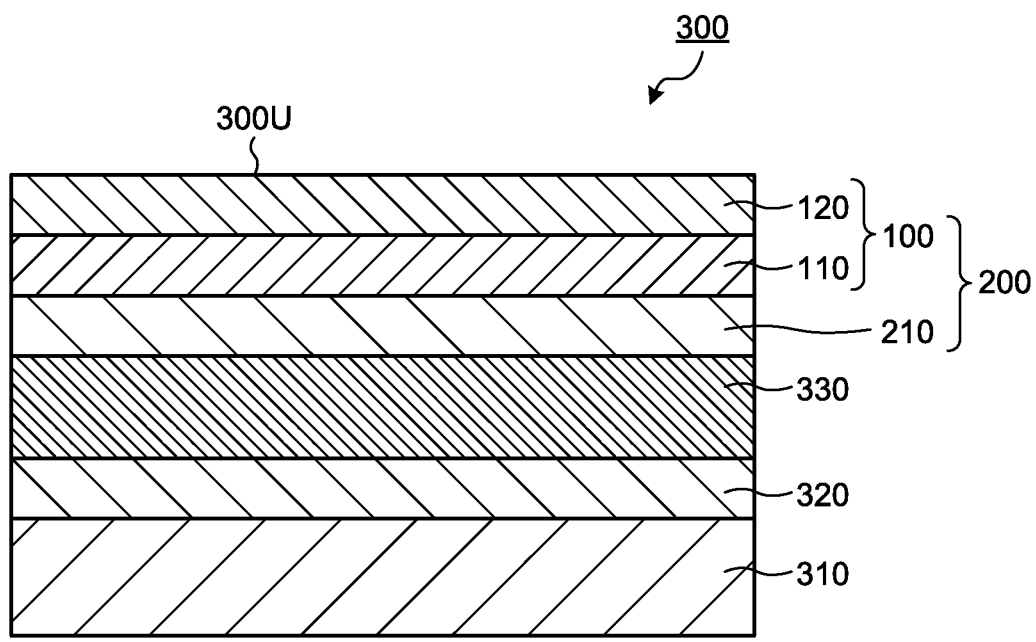
FIG. 5 is a cross-sectional view schematically illustrating a liquid crystal display device as an image display device according to an embodiment of the present invention.

FIG. 5 is a cross-sectional view schematically illustrating a liquid crystal display device 300 as the image display device according to an embodiment of the present invention.

As shown in FIG. 5, the liquid crystal display device 300 includes, in this order: a light source 310; a light source side linear polarizer 320; a liquid crystal cell 330 as the image display element; the polarizer 210 as the viewing side linear polarizer; and the optically anisotropic layered body 100 including the first optically anisotropic layer 110 and the second optically anisotropic layer 120.

The liquid crystal cell 330 may employ any mode of liquid crystal cell, for example, an in-plane switching (IPS) mode, a vertical alignment (VA) mode, a multi-domain vertical alignment (MVA) mode, a continuous spin wheel alignment (CPA) mode, a hybrid alignment nematic (HAN) mode, a twisted nematic (TN) mode, a super-twisted nematic (STN) mode, an optically compensated bend (OCB) mode, and the like.

On such a liquid crystal display device 300, an image is displayed by light which has been emitted from the light source 310 and passed through the light source side linear polarizer 320, the liquid crystal cell 330, the polarizer 210, and the optically anisotropic layered body 100. Thus, the light for displaying the image is linearly polarized light at the time of passing through the polarizer 210, but is converted to circularly polarized light by passing through the optically anisotropic layered body 100. Since the image is displayed by the circularly polarized light in the liquid crystal display device 300 described above, the image can be visually recognized when a display surface 300U is viewed through polarized sunglasses.

Further, in the liquid crystal display device 300 described above, the first optically anisotropic layer 110 and the second optically anisotropic layer 120 included in the optically anisotropic layered body 100 satisfy the above-described requirements. Consequently, the optically anisotropic layered body 100 can convert the light for displaying the image in a wide wavelength range to ideal circularly polarized light and emit such light in a front direction and a tilt direction of the display surface. Thus, the liquid crystal display device 300 according to the present embodiment can reduce change in the color tone of the display surface 300U occurring when the display surface 300U is rotated while being viewed through the polarized sunglasses from the front direction or the tilt direction of the display surface 300U.

Figure 6:
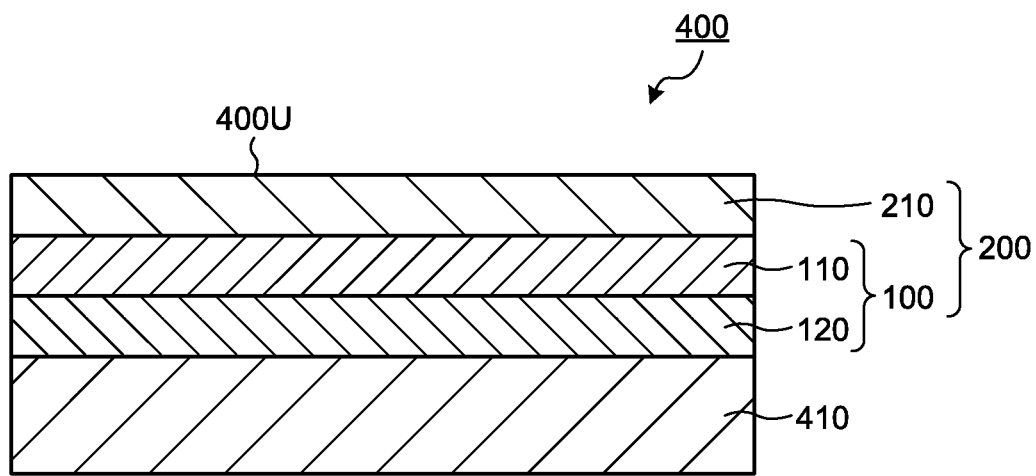
FIG. 6 is a cross-sectional view schematically illustrating an organic EL display device as the image display device according to an embodiment of the present invention.

FIG. 6 is a cross-sectional view schematically illustrating an organic EL display device 400 as the image display device according to an embodiment of the present invention.

As shown in FIG. 6, the organic EL display device 400 includes, in this order: an organic EL element 410 as the image display element; the optically anisotropic layered body 100 including the second optically anisotropic layer 120 and the first optically anisotropic layer 110; and the polarizer 210.

The organic EL element 410 described above includes a transparent electrode layer, a light-emitting layer, and an electrode layer in this order, and light can be generated from the light-emitting layer by applying a voltage to the light-emitting layer from the transparent electrode layer and the electrode layer. Examples of a material constituting the organic light-emitting layer may include a polyparaphenylene vinylene-based material, a polyfluorene-based material, and a polyvinyl carbazole-based material. Further, the light-emitting layer may include a layered body of a plurality of layers having different light emission colors or a mixed layer in which a layer containing a dye is doped with a different dye. Further, the organic EL element 410 may include a functional layer such as a hole injection layer, a hole transport layer, an electron injection layer, an electron transport layer, an equipotential surface-forming layer, and a charge-generating layer.

With such an organic EL display device 400, the circular polarizing plate 200 including the optically anisotropic layered body 100 and the polarizer 210 can suppress a glare on a display surface 400U caused by reflection of external light occurring when the display surface 400U is viewed from a front direction or a tilt direction of the display surface 400U.

Specifically, when light enters from the outside of the device, only a part of the linearly polarized light thereof passes through the polarizer 210. The light then passes through the optically anisotropic layered body 100 and is converted to circularly polarized light. The circularly polarized light is reflected on a constituent element that reflects the light inside the display device (a reflection electrode (not shown) in the organic EL element 410, etc.), and then passes through the optically anisotropic layered body 100 again to become linearly polarized light having an oscillation direction orthogonal to that of the linearly polarized light that has entered. Such linearly polarized light no longer passes through the polarizer 210. In this manner, an anti-reflection function can be achieved.

Further, in the organic EL display device 400 described above, the first optically anisotropic layer 110 and the second optically anisotropic layer 120 included in the optically anisotropic layered body 100 satisfy the above-described requirements. Consequently, the circular polarizing plate 200 can effectively exert the aforementioned anti-reflection function in a wide wavelength range and upon observation in the front direction and the tilt direction of the display surface. Thus, with this organic EL display device 400, excellent visibility can be achieved by effectively suppressing the reflection of external light in the front direction and the tilt direction of the display surface 400U of the organic EL display device 400.

EXAMPLES

Hereinafter, the present invention will be specifically described by illustrating Examples. However, the present invention is not limited to the Examples described below. The present invention may be optionally modified for implementation without departing from the scope of claims of the present invention and its equivalents. In the following description, "%" and "part" representing quantity are on the basis of weight, unless otherwise specified. The operations described below were performed under the conditions of normal temperature and normal pressure in the atmospheric air, unless otherwise specified.

[Evaluation Methods]
[Method for Measuring Phase Difference Properties of Optically Anisotropic Layer]

From a film including the optically anisotropic layer, a sample piece with the size of A4 having a long edge parallel to the lengthwise direction of the film and a short edge parallel to the widthwise direction of the film was cut out.

A surface on the optically anisotropic layer side of the sample piece described above was bonded to one surface of an optically isotropic glass plate by using a hand-application roller. The bonding was performed via a tackiness agent layer ("CS9621" manufactured by Nitto Denko Corp.). The size of the glass plate was 75 mm×25 mm. The bonding was performed such that the long edge of the glass plate was set parallel to the long edge of the sample piece. An excess portion of the sample piece extending out of the glass plate was cut off by a cutter. In this manner, a phase difference plate for measurement having a layer configuration of (glass plate)/(tackiness agent layer)/(optically anisotropic layer) was obtained.

Using the phase difference plate for measurement thus obtained, the in-plane retardations Re(450), Re(550), Re(590), and Re(650) of the optically anisotropic layer at wavelengths of 450 nm, 550 nm, 590 nm, and 650 nm, Rth at a wavelength 590 nm, and the slow axis direction were measured with a phase difference measurement device ("AxoScan" manufactured by Axometrics, Inc.). Then, values of Re(450)/Re(550) and Re(650)/Re(550) of the optically anisotropic layer, and the NZ factor at a wavelength of 590 nm were obtained. Further, the angle of the slow axis of the optically anisotropic layer formed relative to the widthwise direction of the film was obtained.

[Method for Calculating Amounts of Change in Brightness and Hue by Simulation]

A following evaluation model including the optically anisotropic layered body was created by using "LCD Master" manufactured by Shintech, Inc. as software for simulation.

In the evaluation model for simulation, an image display device obtained by bonding the surface on the first optically anisotropic layer side of the optically anisotropic layered body to a display surface of a commercially available liquid crystal display device was set. As the commercially available liquid crystal display device, a liquid crystal display device ("iPad Air (registered trademark) manufactured by Apple Inc.) including the light source, the light source side linear polarizer, the liquid crystal cell, and the viewing side linear polarizer in this order was adopted. The model was set such that, in the aforementioned bonding, the angles θ1 and θ2 of the slow axes of the first optically anisotropic layer and the second optically anisotropic layer of the optically anisotropic layered body formed relative to the polarized light absorption axis of the viewing side linear polarizer were 15.0° and 75.0°, respectively, when viewed from the thickness direction. This image display device includes, from the viewing side, the second optically anisotropic layer, the first optically anisotropic layer, the viewing side linear polarizer, and the liquid crystal cell as the image display element in this order.

Figure 7:
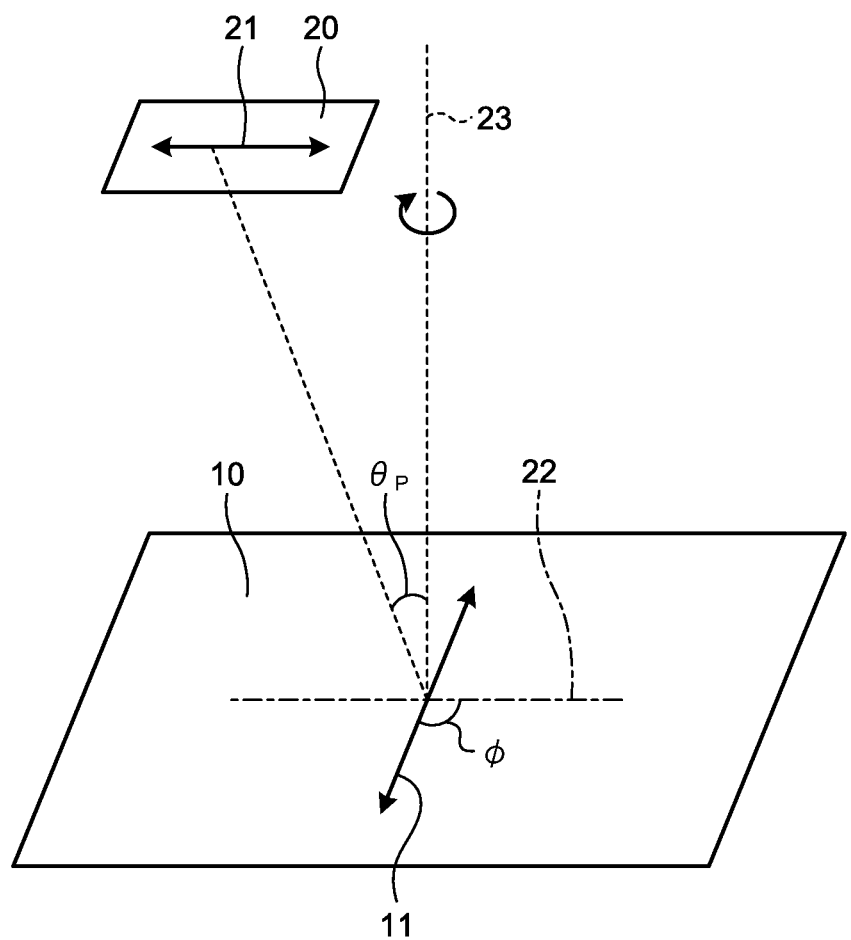
FIG. 7 is a perspective view schematically illustrating the evaluation model set for calculating a change in brightness (ΔL*) and a change in hue (Δa*, Δb*) in the L*a*b* color system in simulations in Examples and Comparative Examples.

FIG. 7 is a perspective view schematically illustrating the evaluation model set for calculating a change in brightness (ΔL*) and a change in hue (Δa*, Δb*) in the L*a*b* color system in simulations in Examples and Comparative Examples. In FIG. 7, on a display surface 10 of the image display device, a line segment 22 parallel to the polarized light absorption axis 21 of polarized sunglasses 20 is shown by a dash-dot line. Further, an axis 23 perpendicular to the display surface 10 of the image display device is shown by a dashed line.

A white image was displayed on the image display device described above and the brightness (L*) and the hue (a*, b*) of the image viewed through the polarized sunglasses 20 were calculated. In the calculation, the viewing direction was set to a direction having the polar angle $\theta_P$ of 0° of the display surface 10 (a front direction of the display surface 10) or a direction having the polar angle $\theta_P$ of 45° of the display surface 10 (a direction tilted by 45° from the front direction of the display surface 10) as shown in FIG. 7. As the polarized sunglasses 20, an ideal polarizing film was set. Herein, the ideal polarizing film refers to a film through which all linearly polarized light having an oscillation direction parallel to a certain direction is allowed to pass while linearly polarized light having an oscillation direction perpendicular to the certain direction is not at all allowed to pass.

The brightness (L*) and the hue (a*, b*) described above were calculated. The calculation was performed in a large number of cases where the display surface 10 was rotated around the axis 23 so as to change an azimuth angle φ of the polarized light absorption axis 21 of the polarized sunglasses 20 formed relative to a reference direction 11 at an interval of 5° in a range of 0° or more and less than 360°. In the calculation, image data of the white image viewed without the polarized sunglasses 20 were set as white. Then, amounts of change (the maximum values–the minimum values) in the brightness (L*) and the hue (a*, b*) thus calculated were calculated to determine the amount of change in the brightness ΔL* and the amount of change in the hue (Δa*, Δb*), respectively. The smaller amounts of change in the brightness and hue mean the less change in the color tone of the display surface, indicating an excellent result.

[Method for Evaluating Change in Color Tone of Image by Visual Inspection]

A white image was displayed on each image display device for evaluation obtained in Examples and Comparative Examples below and the display surface was visually observed through the polarized sunglasses from the front direction (the polar angle of 0°) of the display surface. During this observation, the image display device was rotated once around a rotating axis perpendicular to the display surface. Then, the observed image was evaluated for the changes in the brightness and the hue depending on the rotation angle using evaluation criteria of five scales (A, B, C, D, and E). The evaluation A indicates the smallest change in color depending on the rotation angle, while the evaluation E indicates the largest change in color depending on the rotation angle. The smaller change in color depending on the rotation angle means the less change in the color tone of the display surface, indicating an excellent result.

Further, observation and evaluation were performed in the same manner as described above except that the observation direction was changed from the front direction (the polar angle of 0°) of the display surface to the tilt direction (the polar angle of 45°) of the display surface.

Further, a comprehensive evaluation was performed using the evaluation result obtained by the observation from the front direction (the polar angle of 0°) of the display surface and the evaluation result obtained by the observation from the tilt direction (the polar angle of) 45° of the display surface in accordance with the following method.

(Method for Comprehensive Evaluation)

The five evaluation scales A, B, C, D, and E were given raw points, 5, 4, 3, 2, and 1, respectively. The raw point given in the evaluation by the observation from the front direction (the polar angle of 0°) was multiplied by the raw point given in the evaluation by the observation from the tilt direction (the polar angle of 45°), and the resulting score was evaluated on a scale of five according to the following criteria. The higher resulting score means the better evaluation in reducing the change in the color tone of the display surface.

A: 21 points or higher

B: 16 to 20 points

C: 11 to 15 points

D: 6 to 10 points

E: 1 to 5 points

Production Example 1-1. Production of λ/2 Plate as First Optically Anisotropic Layer (Step A. Production of Resin R1)

A polycarbonate resin R1 was obtained in accordance with the method described in the Synthesis Example 9 in Japanese Patent Application Laid-Open No. 2013-076982 A using 397.3 parts by weight of isosorbide, 960.1 parts by weight of 9,9-bis[4-(2-hydroxyethoxy)phenyl]fluorene, 14.6 parts by weight of polyethylene glycol (the number-average molecular weight of 1,000, manufactured by Sanyo Chemical Industries, Ltd.), 1065.1 parts by weight of diphenyl carbonate, and $8.45 \times 10^{-3}$ parts by weight of magnesium acetate tetrahydrate as a catalyst. The resin R1 has a positive intrinsic birefringence value.

(Step B. Production of Pre-Stretch Film)

After the polycarbonate resin R1 thus obtained was vacuum-dried at 80° C. for 5 hours, the polycarbonate resin R1 was subjected to film formation using a film-forming device including a single-screw extruder, a T-die, a chill roll, and a winder to obtain a long-length pre-stretch film. The thickness of this pre-stretch film was adjusted in a range of 170 to 230 μm so as to obtain a λ/2 plate H1 having properties shown in Tables 1, 2, and 3 below.

(Step C. Production of λ/2 Plate)

The pre-stretch film thus obtained was vacuum-dried at 100° C. for 3 days and then subjected to free uniaxial stretching to obtain the λ/2 plate H1. Conditions for the uniaxial stretching were adjusted within a stretching temperature range: 127 to 177° C. and a stretch ratio range: 1.5 to 2.5 times so as to obtain the λ/2 plate H1 having properties shown in Tables 1, 2, and 3 below. As a result, a phase difference film was obtained.

Production Example 1-2. Production of λ/2 Plate as First Optically Anisotropic Layer A λ/2 plate H2 was obtained in the same manner as in Production Example 1-1 except that, in step B, the thickness of the pre-stretch film was adjusted in a range of 170 to 230 μm so as to obtain the λ/2 plate H2 having properties shown in Table 2 below, and, in step C, the conditions for the uniaxial stretching were adjusted within a stretching temperature range: 127 to 177° C. and a stretch ratio range: 1.5 to 2.5 times so as to obtain the λ/2 plate H2 having properties shown in Table 2 below.

Production Example 1-3. Production of λ/2 Plate as First Optically Anisotropic Layer A λ/2 plate H3 was obtained in the same manner as in Production Example 1-1 except that, in step B, the thickness of the pre-stretch film was adjusted in a range of 170 to 230 μm so as to obtain the λ/2 plate H3 having properties shown in Table 2 below, and, in step C, the conditions for the uniaxial stretching were adjusted within a stretching temperature range: 127 to 177° C. and a stretch ratio range: 1.5 to 2.5 times so as to obtain the λ/2 plate H3 having properties shown in Table 2 below.

Production Example 1-4. Production of λ/2 Plate as First Optically Anisotropic Layer A λ/2 plate H4 was obtained in the same manner as in Production Example 1-1 except that, in step B, the thickness of the pre-stretch film was adjusted in a range of 170 to 230 μm so as to obtain the λ/2 plate H4 having properties shown in Table 2 below, and, in step C, the conditions for the uniaxial stretching were adjusted within a stretching temperature range: 127 to 177° C. and a stretch ratio range: 1.5 to 2.5 times so as to obtain the λ/2 plate H4 having properties shown in Table 2 below.

Production Example 1-5. Production of λ/4 Plate as Second Optically Anisotropic Layer A λ/4 plate QC1 was obtained in the same manner as in Production Example 1-1 except that, in step B, the thickness of the pre-stretch film was adjusted in a range of 70 to 130 μm so as to obtain the λ/4 plate QC1 having properties shown in Table 3 below, and, in step C, the conditions for the uniaxial stretching were adjusted within a stretching temperature range: 127 to 177° C. and a stretch ratio range: 1.5 to 2.5 times so as to obtain the λ/4 plate QC1 having properties shown in Table 3 below.

Production Example 2-1. Production of λ/4 Plate as Second Optically Anisotropic Layer (Step A. Production of Resin R2 as Blend Resin p1)

Pellets of a transparent resin R2 as a blend resin p1 were obtained by kneading, using a twin-screw extruder, 60 parts by weight of syndiotactic polystyrene ("130-ZC" manufactured by Idemitsu Kosan Co., Ltd., the glass transition temperature of 98° C., the crystallizing temperature of 140° C.) and 40 parts by weight of poly(2,6-dimethyl-1,4-phenylene oxide (Sigma-Aldrich catalog number 18242-7). The resin R2 thus obtained had the glass transition temperature of 141° C. The resin R2 has a negative intrinsic birefringence value.

(Step B. Production of Pre-Stretch Film)

A two-type two-layer film molding device (a molding device capable of molding a double-layer structure film using two types of resins) for co-extrusion molding having uniaxial extruders with double-flight-type screws was prepared. The pellets of the resin R2 were charged into one of the uniaxial extruders in the film molding device described above and melted. Further, pellets of a shock resistant polymethylmethacrylate resin R3 ("SUMIPEX (registered trademark) HT55X" manufactured by Sumitomo Chemical Co., Ltd.) were charged into the other uniaxial extruder in the film molding device described above and melted.

The melted resin R2 at 290° C. was supplied to one of manifolds of a multi-manifold die (the surface roughness on die lip Ra: 0.1 μm) through a polymer filter with a mesh size of 10 μm having a leaf disc shape. Further, the melted resin R3 at 260° C. was supplied to the other manifold of the aforementioned multi-manifold die through a polymer filter with a mesh size of 10 μm having a leaf disc shape.

The resin R2 and the resin R3 were extruded simultaneously at 280° C. from the multi-manifold die to be molded in a film shape. The melted resins molded in a film shape were casted onto a casting roll having the surface temperature adjusted to 110° C. and then passed between two cooling rolls having the surface temperature adjusted to 50° C. The resins were cooled and solidified on the casting roll to obtain a pre-stretch film including a layer formed of the resin R2 and a layer composed of the resin R3. During this process, the thickness of the pre-stretch film including the layer formed of the resin R2 (the thickness of 50 to 100 μm) and the layer formed of the resin R3 (the thickness of 50 to 100 μm) was adjusted within a thickness range of 100 to 200

μm by adjusting a rotation speed of the casting roll so as to obtain a λ/4 plate Q1 having properties shown in Table 1 below.

(Step C. Production of λ/4 Plate)

The pre-stretch film thus obtained was subjected to the free uniaxial stretching in the lengthwise direction of the pre-stretch film using a longitudinal stretching machine and then the layer formed of the resin R3 was peeled from the pre-stretch film to produce the λ/4 plate Q1 formed of the resin R2. During this process, the conditions for the free uniaxial stretching were adjusted within a stretching temperature range of 134° C. to 148° C. and a stretch ratio range of 1.3 to 2.0 times so as to obtain the λ/4 plate Q1 having properties shown in Table 1 below. The λ/4 plate thus obtained had a slow axis in the widthwise direction of the λ/4 plate. Further, in this λ/4 plate, a phase difference was not expressed in the acrylic resin layer.

Production Example 2-2. Production of λ/4 Plate as Second Optically Anisotropic Layer A pre-stretch film was obtained in the same manner as in step A and step B in Production Example 2-1 except that the thickness of the pre-stretch film was adjusted within a thickness range of 100 to 200 μm by adjusting the rotation speed of the casting roll in step B in Production Example 2-1 so as to obtain a λ/4 plate Q2 having properties shown in Table 1 below.

The pre-stretch film thus obtained was stretched in the widthwise direction forming an angle of 90° relative to the lengthwise direction using a lateral stretching machine and then the layer formed of the resin R3 was peeled from the pre-stretch film to produce the λ/4 plate Q2 formed of the resin R2.

The conditions for the stretching were adjusted within a stretching temperature range of 134° C. to 148° C. and a stretch ratio range of 1.5 to 3.5 times so as to obtain the λ/4 plate Q2 having properties shown in Table 1 below.

Production Example 2-3. Production of λ/4 Plate as Second Optically Anisotropic Layer A pre-stretch film was obtained in the same manner as in step A and step B in Production Example 2-1 except that the thickness of the pre-stretch film was adjusted within a thickness range of 100 to 200 μm by adjusting the rotation speed of the casting roll in step B in Production Example 2-1 so as to obtain a λ/4 plate Q3 having properties shown in Table 1 below.

The pre-stretch film thus obtained was subjected to the free uniaxial stretching in the lengthwise direction using the longitudinal stretching machine and subsequently stretched in the widthwise direction forming an angle of 90° relative to the lengthwise direction using the lateral stretching machine, and then the layer formed of the resin R3 was peeled from the pre-stretch film to produce the λ/4 plate Q3 composed of the resin R2.

The conditions for the stretching were adjusted within a stretching temperature range of 134° C. to 148° C., a stretch ratio range in the longitudinal direction of 1.1 to 1.5 times, and a stretch ratio range in the lateral direction of 1.5 to 3.5 times so as to obtain the λ/4 plate Q3 having properties shown in Table 1 below.

Production Example 2-4. Production of λ/4 Plate as Second Optically Anisotropic Layer A pre-stretch film was obtained in the same manner as in step A and step B in Production Example 2-1 except that the thickness of the pre-stretch film was adjusted within a thickness range of 100 to 200 μm by adjusting the rotation speed of the casting roll in step B in Production Example 2-1 so as to obtain a λ/4 plate Q4 having properties shown in Table 1 below.

The pre-stretch film thus obtained was subjected to the free uniaxial stretching in the lengthwise direction using the longitudinal stretching machine and subsequently stretched in the widthwise direction forming an angle of 90° relative to the lengthwise direction using the lateral stretching machine, and then the layer formed of the resin R3 was peeled from the pre-stretch film to produce the λ/4 plate Q4 formed of the resin R2.

The conditions for the stretching were adjusted within a stretching temperature range of 134° C. to 148° C., a stretch ratio range in the longitudinal direction of 1.3 to 1.7 times, and a stretch ratio range in the lateral direction of 1.7 to 3.7 times so as to obtain the λ/4 plate Q4 having properties shown in Table 1 below.

Production Example 2-5. Production of λ/4 Plate as Second Optically Anisotropic Layer A pre-stretch film was obtained in the same manner as in step A and step B in Production Example 2-1 except that the thickness of the pre-stretch film was adjusted within a thickness range of 100 to 200 μm by adjusting the rotation speed of the casting roll in step B in Production Example 2-1 so as to obtain a λ/4 plate Q5 having properties shown in Table 2 below.

The pre-stretch film thus obtained was subjected to the free uniaxial stretching in the lengthwise direction using the longitudinal stretching machine and subsequently stretched in the widthwise direction forming an angle of 90° relative to the lengthwise direction using the lateral stretching machine, and then the layer formed of the resin R3 was peeled from the pre-stretch film to produce the λ/4 plate Q5 formed of the resin R2.

The conditions for the stretching were adjusted within a stretching temperature range of 134° C. to 148° C., a stretch ratio range in the longitudinal direction of 1.5 to 2.0 times, and a stretch ratio range in the lateral direction of 2.0 to 4.0 times so as to obtain the λ/4 plate Q5 having properties shown in Table 2 below.

Production Example 2-6. Production of λ/4 Plate as Second Optically Anisotropic Layer A pre-stretch film was obtained in the same manner as in step A and step B in Production Example 2-1 except that the thickness of the pre-stretch film was adjusted within a thickness range of 100 to 200 μm by adjusting the rotation speed of the casting roll in step B in Production Example 2-1 so as to obtain a λ/4 plate Q6 having properties shown in Table 2 below.

The pre-stretch film thus obtained was subjected to the free uniaxial stretching in the lengthwise direction using the longitudinal stretching machine and subsequently stretched in the widthwise direction forming an angle of 90° relative to the lengthwise direction using the lateral stretching machine, and then the layer formed of the resin R3 was peeled from the pre-stretch film to produce the λ/4 plate Q6 formed of the resin R2.

The conditions for the stretching were adjusted within a stretching temperature range of 134° C. to 148° C., a stretch ratio range in the longitudinal direction of 1.1 to 1.5 times, and a stretch ratio range in the lateral direction of 1.5 to 3.5 times so as to obtain the λ/4 plate Q6 having properties shown in Table 2 below.

Production Example 2-7. Production of λ/4 Plate as Second Optically Anisotropic Layer A pre-stretch film was obtained in the same manner as in step A and step B in Production Example 2-1 except that the thickness of the pre-stretch film was adjusted within a thickness range of 100 to 200 μm by adjusting the rotation speed of the casting roll in step B in Production Example 2-1 so as to obtain a λ/4 plate Q7 having properties shown in Table 2 below.

The pre-stretch film thus obtained was subjected to the free uniaxial stretching in the lengthwise direction using the longitudinal stretching machine and subsequently stretched in the widthwise direction forming an angle of 90° relative to the lengthwise direction using the lateral stretching machine, and then the layer formed of the resin R3 was peeled from the pre-stretch film to produce the λ/4 plate Q7 formed of the resin R2.

The conditions for the stretching were adjusted within a stretching temperature range of 134° C. to 148° C., a stretch ratio range in the longitudinal direction of 1.1 to 1.5 times, and a stretch ratio range in the lateral direction of 1.5 to 3.5 times so as to obtain the λ/4 plate Q7 having properties shown in Table 2 below.

Production Example 2-8. Production of λ/4 Plate as Second Optically Anisotropic Layer A pre-stretch film was obtained in the same manner as in step A and step B in Production Example 2-1 except that the thickness of the pre-stretch film was adjusted within a thickness range of 100 to 200 μm by adjusting the rotation speed of the casting roll in step B in Production Example 2-1 so as to obtain a λ/4 plate Q8 having properties shown in Table 2 below.

The pre-stretch film thus obtained was subjected to the free uniaxial stretching in the lengthwise direction using the longitudinal stretching machine and subsequently stretched in the widthwise direction forming an angle of 90° relative to the lengthwise direction using the lateral stretching machine, and then the layer formed of the resin R3 was peeled from the pre-stretch film to produce the λ/4 plate Q8 formed of the resin R2.

The conditions for the stretching were adjusted within a stretching temperature range of 134° C. to 148° C., a stretch ratio range in the longitudinal direction of 1.1 to 1.5 times, and a stretch ratio range in the lateral direction of 1.5 to 3.5 times so as to obtain the λ/4 plate Q8 having properties shown in Table 2 below.

Production Example 3-1. Production of λ/2 Plate as First Optically Anisotropic Layer (Step A. Production of Pre-Stretch Film Formed of Cycloolefin Resin R4)

A single-layer film molding device was prepared. Pellets of a cycloolefin resin R4 ("ZEONOR1420" manufactured by ZEON Corporation, the glass transition temperature of 140° C.) were charged into a uniaxial extruder with a double-flight-type screw in the film molding device and melted at 260° C. The melted resin was passed through a polymer filter with a mesh size of 10 μm having a leaf disc shape and extruded from a die (the surface roughness on die lip Ra: 0.1 μm) having the temperature adjusted to 260° C. to mold the resin in a film shape. The melted resin molded in a film shape was casted onto a casting roll having the surface temperature adjusted to 110° C. and then passed between two cooling rolls having the surface temperature adjusted to 50° C. The resin was cooled and solidified on the casting roll to obtain the pre-stretch film. During this process, the thickness of the pre-stretch film was adjusted within a thickness range of 80 to 120 μm by adjusting the rotation speed of the casting roll so as to obtain a λ/2 plate HC2 having properties shown in Table 3 below.

(Step B. Production of λ/2 Plate)

The pre-stretch film thus obtained was subjected to the free uniaxial stretching to obtain the λ/2 plate HC2. In this process, the conditions for the uniaxial stretching were adjusted within a stretching temperature range: 140 to 150° C. and a stretch ratio range: 1.4 to 1.8 times so as to obtain the λ/2 plate HC2 having properties shown in Table 3 below.

Production Example 3-2. Production of λ/4 Plate as Second Optically Anisotropic Layer A pre-stretch film was obtained in the same manner as in step A in Production Example 3-1 except that the thickness of the pre-stretch film was adjusted within a thickness range of 30 to 70 μm by adjusting the rotation speed of the casting roll in step A so as to obtain a λ/4 plate QC2 having properties shown in Table 3 below. The pre-stretch film thus obtained was subjected to the free uniaxial stretching to obtain the λ/4 plate QC2. During this process, the conditions for the uniaxial stretching were adjusted within a stretching temperature range: 140 to 150° C. and a stretch ratio range: 1.4 to 1.8 times so as to obtain the λ/4 plate QC2 having properties shown in Table 3 below.

Examples and Comparative Examples

Evaluation models for simulation each including the λ/2 plate as the first optically anisotropic layer and the λ/4 plate as the second optically anisotropic layer as described in Examples and Comparative Examples below were used to calculate the amounts of change in the brightness and the hue by the simulations in accordance with the method described above.

Further, image display devices were produced as described in Examples and Comparative Examples below and evaluated for the change in the color tone of the image by visual inspection in accordance with the method described above.

Example 1

As the tackiness agent layer, an optical transparent tackiness sheet ("LUCIACS (registered trademark) CS9621T" manufactured by Nitto Denko Corp.) was prepared. Using this tackiness sheet, the λ/2 plate H1 obtained in Production Example 1-1 and the λ/4 plate Q1 obtained in Production Example 2-1 were bonded such that the slow axis of the λ/2 plate H1 and the slow axis of the λ/4 plate Q1 form an angle of 60°, to thereby obtain an optically anisotropic layered body.

Subsequently, a liquid crystal display device ("iPad (registered trademark)" manufactured by Apple Inc.) including the light source, the light source side linear polarizer, the IPS-mode liquid crystal cell as the image display element, and the viewing side linear polarizer in this order was prepared. A portion of the display surface of this liquid crystal display device was disassembled to expose the viewing side linear polarizer of the liquid crystal display device. A surface on the λ/2 plate side of the optically anisotropic layered body (that is, a surface on the first optically anisotropic layer side) was bonded to the exposed viewing side linear polarizer by using a hand-application roller. The bonding was performed via a tackiness agent layer ("LUCIACS (registered trademark) CS9621T" manufactured by Nitto Denko Corp.). Further, the aforementioned bonding was performed such that angles of the slow axis of the first optically anisotropic layer and the slow axis of the second optically anisotropic layer formed relative to the polarized light absorption axis of the viewing side linear polarizer of the liquid crystal display device were set to 15.0° and 75.0°, respectively, when viewed from the thickness direction.

In this manner, an image display device including the λ/4 plate as the second optically anisotropic layer, the λ/2 plate as the first optically anisotropic, the polarizer, and the liquid crystal cell as the image display element in this order was obtained. The image display device includes the circular polarizing plate including the polarizer, the λ/2 plate as the first optically anisotropic layer, and the λ/4 plate as the second optically anisotropic layer in this order.

Example 2

An optically anisotropic layered body and an image display device including a circular polarizing plate were obtained by the same manner as that of Example 1 except that the λ/4 plate Q2 obtained in Production Example 2-2 was used instead of the λ/4 plate Q1.

Example 3

An optically anisotropic layered body and an image display device including a circular polarizing plate were obtained by the same manner as that of Example 1 except that the λ/4 plate Q3 obtained in Production Example 2-3 was used instead of the λ/4 plate Q1.

Example 4

An optically anisotropic layered body and an image display device including a circular polarizing plate were obtained by the same manner as that of Example 1 except that the λ/4 plate Q4 obtained in Production Example 2-4 was used instead of the λ/4 plate Q1.

Example 5

An optically anisotropic layered body and an image display device including a circular polarizing plate were obtained by the same manner as that of Example 1 except that the λ/4 plate Q5 obtained in Production Example 2-5 was used instead of the λ/4 plate Q1.

Example 6

An optically anisotropic layered body and an image display device including a circular polarizing plate were obtained by the same manner as that of Example 1 except that the λ/2 plate H2 obtained in Production Example 1-2 was used instead of the λ/2 plate H1, and the λ/4 plate Q6 obtained in Production Example 2-6 was used instead of the λ/4 plate Q1.

Example 7

An optically anisotropic layered body and an image display device including a circular polarizing plate were obtained by the same manner as that of Example 1 except that the λ/2 plate H3 obtained in Production Example 1-3 was used instead of the λ/2 plate H1, and the λ/4 plate Q7 obtained in Production Example 2-7 was used instead of the λ/4 plate Q1.

Example 8

An optically anisotropic layered body and an image display device including a circular polarizing plate were obtained by the same manner as that of Example 1 except that the λ/2 plate H4 obtained in Production Example 1-4 was used instead of the λ/2 plate H1, and the λ/4 plate Q8 obtained in Production Example 2-8 was used instead of the λ/4 plate Q1.

Comparative Example 1

An optically anisotropic layered body and an image display device including a circular polarizing plate were obtained by the same manner as that of Example 1 except that the λ/2 plate HC2 obtained in Production Example 3-1 was used instead of the λ/2 plate H1, and the λ/4 plate QC2 obtained in Production Example 3-2 was used instead of the λ/4 plate Q1.

Comparative Example 2

An optically anisotropic layered body and an image display device including a circular polarizing plate were obtained by the same manner as that of Example 1 except that the λ/4 plate QC1 obtained in Production Example 1-5 was used instead of the λ/4 plate Q1.

Configurations of the image display devices in Examples 1 to 4, Examples 5 to 8, and Comparative Examples 1 and 2 were shown in Table 1, Table 2, and Table 3, respectively. Further, the evaluation results were shown in Table 4.

In Tables below, SPSPPE means the blend resin containing syndiotactic polystyrene and poly(2,6-dimethyl-1,4-phenylene oxide) and COP means the cycloolefin resin.

Further, θ1 means an angle formed by the direction of the polarized light absorption axis of the polarizer and the direction that gives the maximum refractive index $nx_1$ (the slow axis direction) in the plane of the λ/2 plate as the first optically anisotropic layer and θ2 means an angle formed by the direction of the polarized light absorption axis of the polarizer and the direction that gives the maximum refractive index $nx_2$ (the slow axis direction) in the plane of the λ/4 plate as the second optically anisotropic layer.

TABLE 1

|  |  | Ex. 1 | Ex. 2 | Ex. 3 | Ex. 4 |
|---|---|---|---|---|---|
| λ/2 | Material | H1<br>Resin (R1)<br>(intrinsic birefringence: positive) | H1<br>Resin (R1)<br>(intrinsic birefringence: positive) | H1<br>Resin (R1)<br>(intrinsic birefringence: positive) | H1<br>Resin (R1)<br>(intrinsic birefringence: positive) |

TABLE 1-continued

|  |  | Ex. 1 | Ex. 2 | Ex. 3 | Ex. 4 |
|---|---|---|---|---|---|
| Wavelength distribution | Re (450)/Re (550) | 0.882 | 0.882 | 0.882 | 0.882 |
|  | Re (650)/Re (550) | 1.042 | 1.042 | 1.042 | 1.042 |
| Phase difference at 590 nm | Re (nm) | 278 | 278 | 278 | 278 |
|  | Rth (nm) | 139 | 139 | 139 | 139 |
|  | NZ factor | 1.00 | 1.00 | 1.00 | 1.00 |
|  | θ1 | 15.0° | 15.0° | 15.0° | 15.0° |
| λ/4 |  | Q1 | Q2 | Q3 | Q4 |
| Material |  | SPSPPE (R2) (intrinsic birefringence: negative) | SPSPPE (R2) (intrinsic birefringence: negative) | SPSPPE (R2) (intrinsic birefringence: negative) | SPSPPE (R2) (intrinsic birefringence: negative) |
| Wavelength distribution | Re (450)/Re (550) | 0.888 | 0.888 | 0.888 | 0.888 |
|  | Re (650)/Re (550) | 1.047 | 1.047 | 1.047 | 1.047 |
| Phase difference at 590 nm | Re (nm) | 139 | 139 | 139 | 139 |
|  | Rth (nm) | −70 | −104 | −139 | −174 |
|  | NZ factor | 0.00 | −0.25 | −0.50 | −0.75 |
|  | θ2 | 75.0° | 75.0° | 75.0° | 75.0° |

TABLE 2

|  |  | Ex. 5 | Ex. 6 | Ex. 7 | Ex. 8 |
|---|---|---|---|---|---|
| λ/2 |  | H1 | H2 | H3 | H4 |
| Material |  | Resin (R1) (intrinsic birefringence: positive) | Resin (R1) (intrinsic birefringence: positive) | Resin (R1) (intrinsic birefringence: positive) | Resin (R1) (intrinsic birefringence: positive) |
| Wavelength distribution | Re (450)/Re (550) | 0.882 | 0.882 | 0.882 | 0.882 |
|  | Re (650)/Re (550) | 1.042 | 1.042 | 1.042 | 1.042 |
| Phase difference at 590 nm | Re (nm) | 278 | 258 | 268 | 288 |
|  | Rth (nm) | 139 | 129 | 134 | 144 |
|  | NZ factor | 1.00 | 1.00 | 1.00 | 1.00 |
|  | θ1 | 15.0° | 15.0° | 15.0° | 15.0° |
| λ/4 |  | Q5 | Q6 | Q7 | Q8 |
| Material |  | SPSPPE (R2) (intrinsic birefringence: negative) | SPSPPE (R2) (intrinsic birefringence: negative) | SPSPPE (R2) (intrinsic birefringence: negative) | SPSPPE (R2) (intrinsic birefringence: negative) |
| Wavelength distribution | Re (450)/Re (550) | 0.888 | 0.888 | 0.888 | 0.888 |
|  | Re (650)/Re (550) | 1.047 | 1.047 | 1.047 | 1.047 |
| Phase difference at 590 nm | Re (nm) | 139 | 129 | 134 | 144 |
|  | Rth (nm) | −208 | −129 | −134 | −144 |
|  | NZ factor | −1.00 | −0.50 | −0.50 | −0.50 |
|  | θ2 | 75.0° | 75.0° | 75.0° | 75.0° |

TABLE 3

|  |  | Comp. Ex. 1 | Comp. Ex. 2 |
|---|---|---|---|
| λ/2 |  | HC2 | H1 |
| Material |  | COP(R4) | Resin (R1) (intrinsic birefringence: positive) |
| Wavelength distribution | Re(450)/Re(550) | 1.008 | 0.882 |
|  | Re(650)/Re(550) | 0.996 | 1.042 |
| Phase difference | Re(nm) | 246 | 278 |
|  | Rth(nm) | 123 | 139 |
| at 590 nm | NZ factor | 1.00 | 1.00 |
|  | θ1 | 15.0° | 15.0° |
| λ/4 |  | QC2 | QC1 |
| Material |  | COP(R4) | Resin (R1) (intrinsic birefringence: positive) |
| Wavelength distribution | Re(450)/Re(550) | 1.008 | 0.882 |
|  | Re(650)/Re(550) | 0.996 | 1.042 |

TABLE 3-continued

|  |  | Comp. Ex. 1 | Comp. Ex. 2 |
|---|---|---|---|
| Phase difference at 590 nm | Re(nm) | 123 | 139 |
| | Rth(nm) | 62 | 69 |
| | NZ factor | 1.00 | 1.00 |
| θ2 | | 75.0° | 75.0° |

TABLE 4

| | Polar angle 0° all azimuth average | | | | Polar angle 45° all azimuth average | | | | Comprehensive evaluation |
|---|---|---|---|---|---|---|---|---|---|
| | ΔL* | Δa* | Δb* | Visual inspection | ΔL* | Δa* | Δb* | Visual inspection | |
| Ex. 1 | 0.31 | 1.64 | 1.40 | A | 1.10 | 1.57 | 2.38 | B | B |
| Ex. 2 | 0.31 | 1.64 | 1.40 | A | 1.16 | 1.51 | 1.79 | A | A |
| Ex. 3 | 0.31 | 1.64 | 1.40 | A | 1.91 | 1.51 | 1.62 | A | A |
| Ex. 4 | 0.31 | 1.64 | 1.40 | A | 2.85 | 1.52 | 1.49 | B | B |
| Ex. 5 | 0.31 | 1.64 | 1.40 | A | 3.97 | 1.54 | 1.39 | C | C |
| Ex. 6 | 1.25 | 1.93 | 2.51 | B | 2.49 | 1.76 | 2.41 | B | B |
| Ex. 7 | 0.60 | 1.79 | 1.58 | A | 2.09 | 1.63 | 1.84 | B | B |
| Ex. 8 | 0.27 | 1.50 | 2.37 | B | 1.72 | 1.39 | 2.52 | B | B |
| Comp. Ex. 1 | 2.00 | 5.61 | 0.93 | E | 4.03 | 5.30 | 8.14 | E | E |
| Comp. Ex. 2 | 0.26 | 1.37 | 0.40 | A | 4.11 | 1.56 | 2.65 | D | D |

It is understood that the image display devices in Examples 1 to 8 gain the higher comprehensive evaluations than those in Comparative Examples, and thus have reduced changes in the color tone of the display surfaces.

On the other hand, it is understood that the image display devices in Comparative Examples 1 and 2, in which the λ/4 plates as the second optically anisotropic layers do not satisfy the formula (8), have the larger changes in the color tone than those in Examples when viewed from the tilt direction (the polar angle of 45°). Further, it is understood that the image display device in Comparative Example 1, in which the λ/2 plate as the first optically anisotropic layer does not satisfy the formulae (2) and (3) and the λ/4 plate as the second optically anisotropic layer does not satisfy the formulae (6) and (7), has the larger change in the color tone than those in Examples when viewed from the front direction (the polar angle of 0°) and the tilt direction (the polar angle of 45°).

From the results described above, it is understood that the optically anisotropic layered body, the circular polarizing plate, and the image display device of the present invention can reduce the change in the color tone that occurs when the display surface is rotated while being viewed through the polarized sunglasses from the front direction or the tilt direction of the display surface.

REFERENCE SIGN LIST

100 optically anisotropic layered body
110 first optically anisotropic layer
120 second optically anisotropic layer
200 circular polarizing plate
210 polarizer
300 liquid crystal display device
310 light source
320 light source side linear polarizer
330 liquid crystal cell
400 organic EL display device
410 organic EL element

The invention claimed is:

1. A liquid crystal display device including a liquid crystal cell, polarizer, and adhesive layer, a first optically anisotropic layer and a second optically anisotropic layer in this order, wherein the adhesive layer contains a photocurable adhesive containing 50% by weight or more of a (meth)acrylate monomer having a hydroxyl group, and has a thickness of 0.5 μm or more and 30 μm or less,
the first optically anisotropic layer satisfies the following formula (1), formula (2), formula (3), and formula (4), and
the second optically anisotropic layer satisfies the following formula (5), formula (6), formula (7), and formula (8'):

$$220 \text{ nm} < Re1(590) < 330 \text{ nm} \tag{1}$$

$$Re1(450)/Re1(550) \leq 1.0 \tag{2}$$

$$Re1(650)/Re1(550) \geq 1.0 \tag{3}$$

$$0.95 < NZ1 < 2.00 \tag{4}$$

$$110 \text{ nm} < Re2(590) < 165 \text{ nm} \tag{5}$$

$$Re2(450)/Re2(550) \leq 1.0 \tag{6}$$

$$Re2(650)/Re2(550) \geq 1.0 \tag{7}$$

$$-1.5 \leq NZ2 \leq -0.30 \tag{8'}$$

wherein
Re1(450), Re1(550), Re1(590), and Re1(650) represent in-plane retardations Re of the first optically anisotropic layer at wavelengths of 450 nm, 550 nm, 590 nm, and 650 nm, respectively,
NZ1 represents an NZ factor of the first optically anisotropic layer at a wavelength of 590 nm,
Re2(450), Re2(550), Re2(590), and Re2(650) represent in-plane retardations Re of the second optically anisotropic layer at wavelengths of 450 nm, 550 nm, 590 nm, and 650 nm, respectively, and
NZ2 represents an NZ factor of the second optically anisotropic layer at a wavelength of 590 nm.

2. The liquid crystal display device according to claim 1, wherein an angle formed by a direction that gives a maximum refractive index nx1 in a plane of the first optically anisotropic layer and a direction that gives a maximum refractive index nx2 in a plane of the second optically anisotropic layer is 60°±10°.

3. The liquid crystal display device according to claim 1, wherein the second optically anisotropic layer includes a layer formed of a resin containing a polyphenylene ether and a polystyrene-based polymer having a syndiotactic structure.

4. The liquid crystal display device according to claim 3, wherein a weight ratio of the polyphenylene ether relative to the polystyrene-based polymer having a syndiotactic structure is 35/65 or more and 45/55 or less.

5. The liquid crystal display device according to claim 1, wherein an angle θ1 formed by a polarized light absorption axis direction of the polarizer and a direction that gives a maximum refractive index nx1 in the plane of the first optically anisotropic layer satisfies the following formula (9), and an angle θ2 formed by the polarized light absorption axis direction of the polarizer and a direction that gives a maximum refractive index nx2 in the plane of the second optically anisotropic layer satisfies the following formula (10):

$$|\theta_1| = 15° \pm 5° \tag{9}$$

$$|\theta_2| = 75° \pm 10° \tag{10}$$

where the angles θ1 and θ2 have the same signs.

6. The liquid crystal display device according to claim 1, wherein an angle θ1 formed by a polarized light absorption axis direction of the polarizer and a direction that gives a maximum refractive index nx1 in the plane of the first optically anisotropic layer satisfies the following formula (11), and an angle θ2 formed by the polarized light absorption axis direction of the polarizer and a direction that gives a maximum refractive index nx2 in the plane of the second optically anisotropic layer satisfies the following formula (12):

$$|\theta_1| = 75° \pm 5° \tag{11}$$

$$|\theta_2| = 15° \pm 10° \tag{12}$$

where the angles θ1 and θ2 have the same signs.

* * * * *